US010943636B1

(12) United States Patent
Wu et al.

(10) Patent No.: US 10,943,636 B1
(45) Date of Patent: Mar. 9, 2021

(54) APPARATUSES AND METHODS FOR ANALOG ROW ACCESS TRACKING

(71) Applicant: MICRON TECHNOLOGY, INC., Boise, ID (US)

(72) Inventors: Jun Wu, Su Zhou (CN); Liang Li, Shanghai (CN); Yu Zhang, Shanghai (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/546,152

(22) Filed: Aug. 20, 2019

(51) Int. Cl.
*G11C 7/00* (2006.01)
*G11C 11/406* (2006.01)
*G11C 11/408* (2006.01)

(52) U.S. Cl.
CPC .... *G11C 11/40603* (2013.01); *G11C 11/4085* (2013.01); *G11C 11/4087* (2013.01); *G11C 11/40611* (2013.01)

(58) Field of Classification Search
CPC ............................................... G11C 11/40603
USPC ....................................................... 365/222
See application file for complete search history.

(56) References Cited

U.S. PATENT DOCUMENTS

| 5,299,159 | A | 3/1994 | Balistreri et al. |
| 5,422,850 | A | 6/1995 | Sukegawa et al. |
| 5,699,297 | A | 12/1997 | Yamazaki et al. |
| 5,768,196 | A | 6/1998 | Bloker et al. |
| 5,933,377 | A | 8/1999 | Hidaka |
| 5,943,283 | A | 8/1999 | Wong et al. |
| 5,970,507 | A | 10/1999 | Kato et al. |
| 6,011,734 | A | 1/2000 | Pappert |
| 6,061,290 | A | 5/2000 | Shirley |
| 6,212,118 | B1 | 4/2001 | Fujita |
| 6,310,806 | B1 | 10/2001 | Higashi et al. |

(Continued)

FOREIGN PATENT DOCUMENTS

| CN | 1195173 A | 10/1998 |
| CN | 101038785 A | 9/2007 |

(Continued)

OTHER PUBLICATIONS

U.S. Appl. No. 16/797,658, titles "Apparatuses and Methods for Controlling Refresh Operations", filed Feb. 21, 2020.

(Continued)

*Primary Examiner* — Hoai V Ho
(74) *Attorney, Agent, or Firm* — Dorsey & Whitney LLP

(57) ABSTRACT

Embodiments of the disclosure are drawn to apparatuses and methods for analog row access tracking. A plurality of unit cells are provided, each of which contains one or more analog circuits used to track accesses to a portion of the wordlines of a memory device. When a wordline in the portion is accessed, the unit cell may update an accumulator voltage, for example by adding charge to a capacitor. A comparator circuit may determine when one or more accumulator voltages cross a threshold (e.g., a reference voltage). Responsive to the accumulator voltage crossing the threshold, an aggressor address may be loaded in a targeted refresh queue, or if the aggressor address is already in the queue, a priority flag associated with that address may be set. Aggressor addresses may be provided to have their victims refreshed in an order based on the number of set priority flags.

13 Claims, 8 Drawing Sheets

(56) References Cited

U.S. PATENT DOCUMENTS

| | | |
|---|---|---|
| 6,317,381 B1 | 11/2001 | Gans et al. |
| 6,424,582 B1 | 7/2002 | Ooishi |
| 6,434,064 B2 | 8/2002 | Nagai |
| 6,452,868 B1 | 9/2002 | Fister |
| 6,567,340 B1 | 5/2003 | Nataraj et al. |
| 6,950,364 B2 | 9/2005 | Kim |
| 7,027,343 B2 | 4/2006 | Sinha et al. |
| 7,057,960 B1 | 6/2006 | Fiscus et al. |
| 7,187,607 B2 | 3/2007 | Koshikawa et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,444,577 B2 | 10/2008 | Best et al. |
| 7,551,502 B2 | 6/2009 | Dono et al. |
| 7,830,742 B2 | 11/2010 | Han |
| 8,451,677 B2 | 5/2013 | Okahiro et al. |
| 8,625,360 B2 | 1/2014 | Iwamoto et al. |
| 8,681,578 B2 | 3/2014 | Narui |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,058,900 B2 | 6/2015 | Kang |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,139 B2 | 11/2015 | Jung et al. |
| 9,286,964 B2 | 3/2016 | Halbert et al. |
| 9,299,457 B2 | 3/2016 | Chun et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,412,432 B2 | 8/2016 | Narui et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,741,409 B2 | 8/2017 | Jones et al. |
| 9,741,447 B2 | 8/2017 | Akamatsu |
| 9,747,971 B2 | 8/2017 | Bains et al. |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,818,469 B1 | 11/2017 | Kim et al. |
| 9,865,326 B2 | 1/2018 | Bains et al. |
| 9,922,694 B2 | 3/2018 | Akamatsu |
| 9,934,143 B2 | 4/2018 | Bains et al. |
| 9,953,696 B2 | 4/2018 | Kim |
| 10,032,501 B2 | 7/2018 | Ito et al. |
| 10,083,737 B2 | 9/2018 | Bains et al. |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,176,860 B1 | 1/2019 | Mylavarapu |
| 10,210,925 B2 | 2/2019 | Bains et al. |
| 10,297,305 B1 | 5/2019 | Moon et al. |
| 10,339,994 B2 | 7/2019 | Ito et al. |
| 10,387,276 B2 | 8/2019 | Ryu et al. |
| 10,600,462 B2 | 3/2020 | Augustine et al. |
| 10,600,491 B2 | 3/2020 | Chou et al. |
| 10,607,686 B2 | 3/2020 | Akamatsu |
| 10,629,286 B2 | 4/2020 | Lee et al. |
| 10,679,710 B2 | 6/2020 | Hirashima et al. |
| 10,770,127 B2 | 9/2020 | Shore et al. |
| 2001/0008498 A1 | 7/2001 | Ooishi |
| 2002/0181301 A1 | 12/2002 | Takahashi et al. |
| 2003/0063512 A1 | 4/2003 | Takahashi et al. |
| 2003/0067825 A1 | 4/2003 | Shimano et al. |
| 2003/0090400 A1 | 5/2003 | Barker |
| 2003/0123301 A1 | 7/2003 | Jang et al. |
| 2003/0193829 A1 | 10/2003 | Morgan et al. |
| 2004/0008544 A1 | 1/2004 | Shinozaki et al. |
| 2004/0022093 A1 | 2/2004 | Lee |
| 2004/0114446 A1 | 6/2004 | Takahashi et al. |
| 2004/0130959 A1 | 7/2004 | Kawaguchi |
| 2004/0174757 A1 | 9/2004 | Garverick et al. |
| 2004/0184323 A1 | 9/2004 | Mori et al. |
| 2004/0218431 A1 | 11/2004 | Chung et al. |
| 2005/0105315 A1 | 5/2005 | Shin et al. |
| 2005/0243629 A1 | 11/2005 | Lee |
| 2005/0265104 A1 | 12/2005 | Remaklus et al. |
| 2006/0083099 A1 | 4/2006 | Bae et al. |
| 2006/0087903 A1 | 4/2006 | Riho et al. |
| 2006/0176744 A1 | 8/2006 | Stave |
| 2006/0262616 A1 | 11/2006 | Chen |
| 2007/0008799 A1 | 1/2007 | Dono et al. |
| 2007/0014174 A1 | 1/2007 | Ohsawa |
| 2007/0030746 A1 | 2/2007 | Best et al. |
| 2007/0133330 A1 | 6/2007 | Ohsawa |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0253212 A1 | 10/2008 | Iida et al. |
| 2008/0266990 A1 | 10/2008 | Loeffler |
| 2008/0316845 A1 | 12/2008 | Wang et al. |
| 2009/0077571 A1 | 3/2009 | Gara et al. |
| 2009/0161457 A1 | 6/2009 | Wakimoto |
| 2009/0185440 A1 | 7/2009 | Lee |
| 2009/0201752 A1 | 8/2009 | Riho et al. |
| 2009/0296510 A1 | 12/2009 | Lee et al. |
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0329069 A1 | 12/2010 | Ito et al. |
| 2011/0026290 A1 | 2/2011 | Noda et al. |
| 2011/0069572 A1 | 3/2011 | Lee et al. |
| 2011/0216614 A1 | 9/2011 | Hosoe |
| 2011/0286271 A1 | 11/2011 | Chen |
| 2011/0310648 A1 | 12/2011 | Iwamoto et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2013/0003467 A1 | 1/2013 | Klein |
| 2013/0003477 A1 | 1/2013 | Park et al. |
| 2013/0304982 A1 | 11/2013 | Jung et al. |
| 2014/0006703 A1 | 1/2014 | Bains et al. |
| 2014/0006704 A1 | 1/2014 | Greenfield et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0177370 A1 | 6/2014 | Halbert et al. |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0355332 A1 | 12/2014 | Youn et al. |
| 2015/0049567 A1 | 2/2015 | Chi |
| 2015/0055420 A1 | 2/2015 | Bell et al. |
| 2015/0089326 A1 | 3/2015 | Joo et al. |

(56) References Cited

U.S. PATENT DOCUMENTS

| | | |
|---|---|---|
| 2015/0155027 A1 | 6/2015 | Abe et al. |
| 2015/0170728 A1 | 6/2015 | Jung et al. |
| 2015/0206572 A1 | 7/2015 | Lim et al. |
| 2015/0213872 A1 | 7/2015 | Mazumder et al. |
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1 | 10/2015 | Greenberg et al. |
| 2015/0279442 A1 | 10/2015 | Hwang |
| 2015/0294711 A1 | 10/2015 | Gaither et al. |
| 2015/0340077 A1 | 11/2015 | Akamatsu |
| 2016/0019940 A1 | 1/2016 | Jang et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0125931 A1 | 5/2016 | Doo et al. |
| 2016/0133314 A1 | 5/2016 | Hwang et al. |
| 2016/0140243 A1 | 5/2016 | Adams et al. |
| 2016/0172056 A1 | 6/2016 | Huh |
| 2016/0180917 A1 | 6/2016 | Chishti et al. |
| 2016/0196863 A1 | 7/2016 | Shin et al. |
| 2016/0202926 A1 | 7/2016 | Benedict |
| 2016/0225461 A1 | 8/2016 | Tuers et al. |
| 2017/0076779 A1 | 3/2017 | Bains et al. |
| 2017/0092350 A1 | 3/2017 | Halbert et al. |
| 2017/0117030 A1 | 4/2017 | Fisch et al. |
| 2017/0140811 A1 | 5/2017 | Joo |
| 2017/0213586 A1 | 7/2017 | Kang et al. |
| 2017/0263305 A1 | 9/2017 | Cho |
| 2017/0287547 A1 | 10/2017 | Ito et al. |
| 2017/0323675 A1 | 11/2017 | Jones et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0005690 A1 | 1/2018 | Morgan et al. |
| 2018/0025770 A1 | 1/2018 | Ito et al. |
| 2018/0060194 A1 | 3/2018 | Ryu et al. |
| 2018/0090199 A1 | 3/2018 | Kim et al. |
| 2018/0114561 A1 | 4/2018 | Fisch et al. |
| 2018/0158504 A1 | 6/2018 | Akamatsu |
| 2018/0182445 A1 | 6/2018 | Lee et al. |
| 2018/0203621 A1 | 7/2018 | Ahn et al. |
| 2018/0218767 A1 | 8/2018 | Wolff |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2019/0013059 A1 | 1/2019 | Akamatsu |
| 2019/0051344 A1 | 2/2019 | Bell et al. |
| 2019/0066759 A1 | 2/2019 | Nale |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0198090 A1 | 6/2019 | Lee |
| 2019/0198099 A1 | 6/2019 | Mirichigni et al. |
| 2019/0207736 A1 | 7/2019 | Ben-tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237132 A1 | 8/2019 | Morohashi |
| 2019/0243708 A1 | 8/2019 | Cha et al. |
| 2019/0267077 A1 | 8/2019 | Ito et al. |
| 2019/0333573 A1 | 10/2019 | Shin et al. |
| 2019/0348100 A1 | 11/2019 | Smith et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0385667 A1 | 12/2019 | Morohashi et al. |
| 2020/0075106 A1* | 3/2020 | Tokutomi .......... G06F 3/0659 |
| 2020/0090760 A1 | 3/2020 | Purahmad et al. |
| 2020/0194050 A1 | 6/2020 | Akamatsu |
| 2020/0201380 A1 | 6/2020 | Murali et al. |
| 2020/0202921 A1 | 6/2020 | Morohashi et al. |
| 2020/0211633 A1 | 7/2020 | Okuma |
| 2020/0251158 A1 | 8/2020 | Shore et al. |
| 2020/0302994 A1 | 9/2020 | Enomoto et al. |

FOREIGN PATENT DOCUMENTS

| | | |
|---|---|---|
| CN | 101067972 A | 11/2007 |
| CN | 101331554 A | 12/2008 |
| CN | 101458658 A | 6/2009 |
| CN | 101622607 A | 1/2010 |
| CN | 102113058 A | 6/2011 |
| CN | 102483952 A | 5/2012 |
| JP | 2005-216429 A | 8/2005 |
| JP | 2011-258259 | 12/2011 |
| JP | 2011-258259 | 12/2011 |
| JP | 2013-004158 A | 1/2013 |
| KR | 1020180064940 A | 6/2018 |
| KR | 1020180085184 A | 7/2018 |
| WO | 2014120477 | 8/2014 |
| WO | 2015030911 A1 | 3/2015 |
| WO | 2017171927 A1 | 10/2017 |
| WO | 2020191222 A1 | 9/2020 |

OTHER PUBLICATIONS

U.S. Appl. No. 15/881,256 entitled 'Apparatuses and Methods for Detecting a Row Hammer Attack With a Bandpass Filter' filed Jan. 26, 2018.

U.S. Appl. No. 16/513,400 titled "Apparatuses and Methods for Tracking Row Accesses" filed Jul. 16, 2019.

U.S. Appl. No. 15/789,897, entitled "Apparatus and Methods for Refreshing Memory", filed Oct. 20, 2017; pp. all.

U.S. Appl. No. 15/796,340, entitled: "Apparatus and Methods for Refreshing Memory" filed Oct. 27, 2017; pp. all.

U.S. Appl. No. 16/176,932, titled "Apparatuses and Methods for Access Based Refresh Timing", filed Oct. 31, 2018.

U.S. Appl. No. 16/237,291, titled "Apparatus and Methods for Refreshing Memory", filed Dec. 31, 2018.

U.S. Appl. No. 16/805,197, titled "Apparatuses and Methods for Calculating Row Hammer Refresh Addresses in a Semiconductor Device", filed Feb. 28, 2020.

U.S. Appl. No. 16/548,027 titled "Apparatuses, Systems, and Methods for Analog Row Access Rate Determination" filed Aug. 22, 2019.

U.S. Appl. No. 16/549,942 titled "Apparatuses and Methods for Lossy Row Access Counting" filed Aug. 23, 2019.

U.S. Appl. No. 16/425,525 titled "Apparatuses and Methods for Tracking All Row Accesses" filed May 29, 2019.

U.S. Appl. No. 16/427,105 titled "Apparatuses and Methods for Priority Targeted Refresh Operations" filed May 30, 2019.

U.S. Appl. No. 16/427,140 titled "Apparatuses and Methods for Tracking Row Access Counts Between Multiple Register Stacks" filed May 30, 2019.

U.S. Appl. No. 16/437,811 titled "Apparatuses, Systems, and Methods for Determining Extremum Numerical Values" filed Jun. 11, 2019.

U.S. Appl. No. 16/012,679, titled "Apparatuses and Methods for Multiple Row Hammer Refresh Address Sequences", filed Jun. 19, 2018.

U.S. Appl. No. 16/268,818, titled "Apparatuses and Methods for Managing Row Access Counts", filed Feb. 6, 2019.

U.S. Appl. No. 16/358,587, titled "Semiconductor Device Having Cam That Stores Address Signals", filed Mar. 19, 2019.

U.S. Appl. No. 16/411,573 titled "Apparatuses, Systems, and Methods for a Content Addressable Memory Cell" filed May 14, 2019.

U.S. Appl. No. 16/427,330 titled "Apparatuses and Methods for Storing Victim Row Data" filed May 30, 2019.

U.S. Appl. No. 16/428,625 titled "Apparatuses and Methods for Tracking Victim Rows" filed May 31, 2019.

U.S. Appl. No. 16/459,520 titled "Apparatuses and Methods for Monitoring Word Line Accesses", filed Jul. 1, 2019, pp. all.

(56) References Cited

OTHER PUBLICATIONS

Kim, et al., "Flipping Bits in Memory Without Accessing Them: An Experimental Study of DRAM Disturbance Errors", IEEE, Jun. 2014, 12 pgs.
U.S. Appl. No. 15/884,192 entitled 'Semiconductor Device Performing Row Hammer Refresh Operation' filed Jan. 30, 2018.
U.S. Appl. No. 16/936,297 titled "Apparatuses and Methods for Managing Row Access Counts" filed Jul. 22, 2020.
Thomas, et al., "Voltage Source Based Voltage-to-Time Converter", IEEE, 2020, p. All.

* cited by examiner

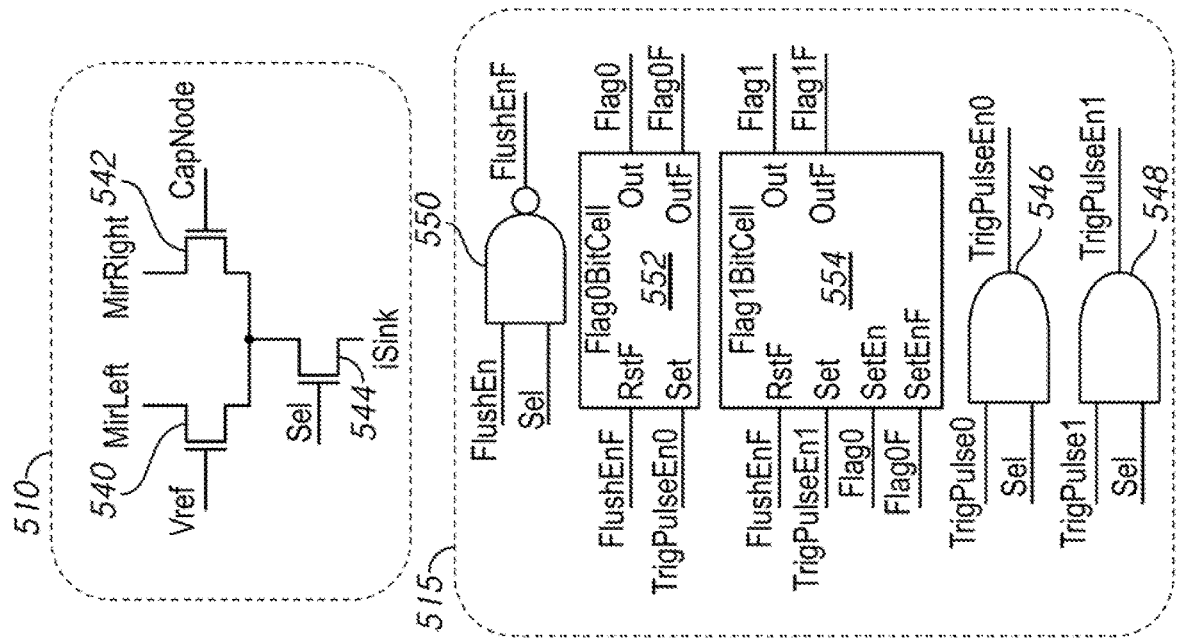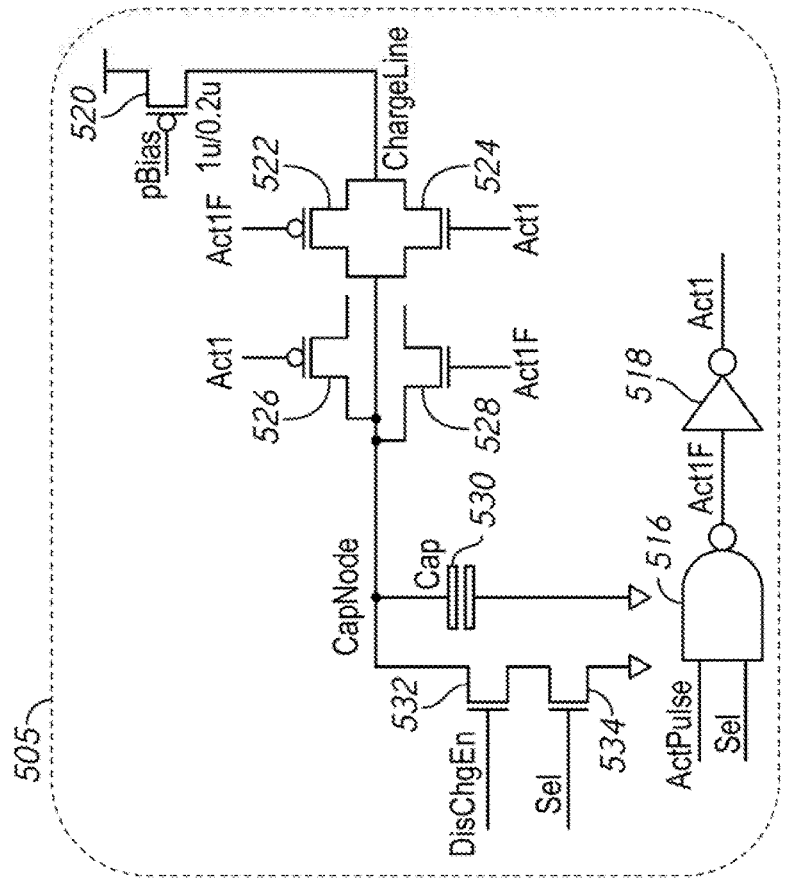
FIG. 5

APPARATUSES AND METHODS FOR ANALOG ROW ACCESS TRACKING

BACKGROUND

Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. An auto-refresh operation may be carried out where a sequence of memory cells are periodically refreshed. Repeated access to a particular memory cell or group of memory cells (often referred to as a 'row hammer') may cause an increased rate of data degradation in nearby memory cells. In addition to the auto-refresh operations, it may be desirable to identify and refresh memory cells affected by the row hammer in a targeted refresh operation.

BRIEF DESCRIPTION OF THE DRAWINGS

FIG. 5 is a schematic diagram of a unit cell according to an embodiment of the present disclosure.

DETAILED DESCRIPTION

Figure 1:
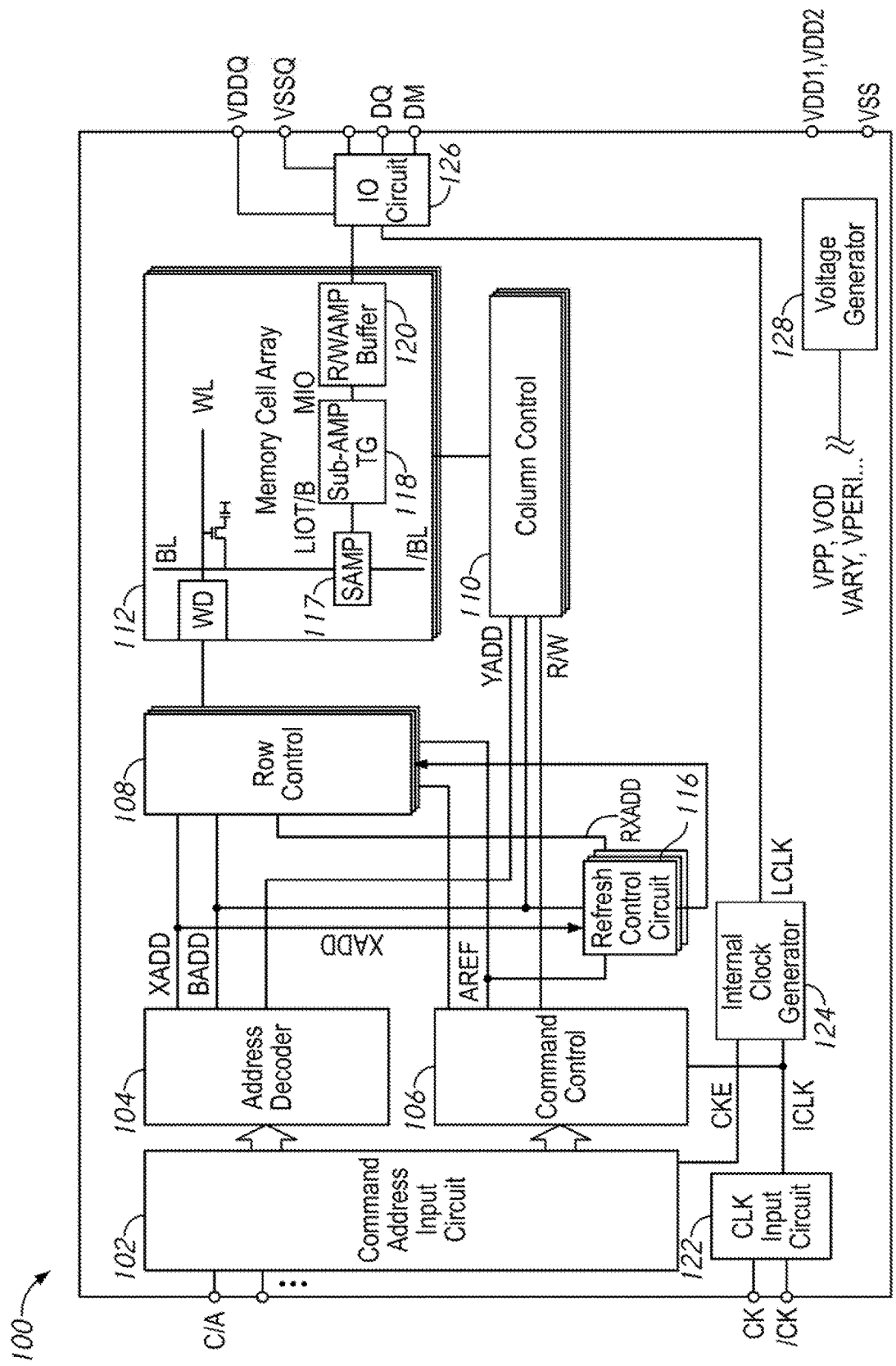
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a plurality of memory cells. The memory cells may store information (e.g., as one or more bits), and may be organized at the intersection of wordlines (rows) and bit lines (columns). A number of wordlines and bit lines may be organized into a memory bank. A memory device may include a number of different memory banks. The memory device may receive one or more command signals which may indicate operations in one or more of the banks of one or more memory packages. The memory device may enter a refresh mode, in which wordlines in one or more of the memory banks are refreshed.

Information in the memory cells may decay over time. The memory cells may be refreshed on a row-by-row basis to preserve information in the memory cells. During a refresh operation, the information in one or more rows may be rewritten back to the respective rows to restore an initial value of the information. Repeated access to a given row (e.g., an aggressor row) may cause an increased rate of information decay in one or more neighboring rows (e.g., victim rows). Accesses to different rows of the memory may be tracked in order to determine likely victim rows and refresh them as part of a targeted (or 'row hammer') refresh operation. However, individually tracking every row access with digital counters may be difficult due to space and/or power limitations of the device.

The present disclosure is drawn to apparatuses, systems, and methods for analog row access tracking. A refresh control circuit may include a number of analog unit cells, each of which includes a number of circuits which are used to track accesses to one or more wordlines of the memory device. Each unit cell may track accesses to a portion of the wordlines, and together the unit cells may track accesses to all wordlines of the memory. When a given wordline is accessed, a stack control circuit may send signals to the unit cell which tracks that wordline. Responsive to those signals, the unit cell may update a voltage (e.g., by increasing an amount of charge on a capacitor). Based on that voltage (e.g., when the voltage crosses a reference voltage), one or more wordlines associated with the unit cell may be flagged for a targeted refresh operation.

In some embodiments, the refresh control circuit may also include a targeted refresh queue, which may store addresses for refreshing as part of a targeted refresh operation after they have been flagged for refresh by a unit cell. When the voltage in one of the unit cells crosses a threshold level (e.g., a reference voltage), one or more addresses associated with the unit cell may be added to the targeted refresh queue, and the voltage in the unit cell may be reset. In some embodiments, each address in the targeted refresh queue may include one or more priority flags. When the voltage in the unit cell crosses the threshold, if the addresses associated with the unit cell are already in the targeted refresh queue (e.g., when a queue address to be stored matches one of the stored queue addresses), one or more of the priority flags may be set (e.g., the level of the flag may be switched). Addresses in the targeted refresh queue may be refreshed in an order based on the number of priority flags which are set.

FIG. 1 is a block diagram of a semiconductor device according to an embodiment of the disclosure. The semiconductor device 100 may be a semiconductor memory device, such as a DXADDM device integrated on a single semiconductor chip.

The semiconductor device 100 includes a memory array 112. In some embodiments, the memory array 112 may include of a plurality of memory banks. Each memory bank includes a plurality of wordlines WL, a plurality of bit lines BL and /BL, and a plurality of memory cells MC arranged at intersections of the plurality of wordlines WL and the plurality of bit lines BL and /BL. The selection of the wordline WL is performed by a row control 108 and the selection of the bit lines BL and /BL is performed by a column control 110. In some embodiments, there may be a row control 108 and column control 110 for each of the memory banks.

The bit lines BL and /BL are coupled to a respective sense amplifier (SAMP) 117. Read data from the bit line BL or /BL is amplified by the sense amplifier SAMP 117, and transferred to read/write amplifiers 120 over complementary local data lines (LIOT/B), transfer gate (TG) 118, and complementary main data lines (MIO). Conversely, write data outputted from the read/write amplifiers 120 is transferred to the sense amplifier 117 over the complementary main data lines MIO, the transfer gate 118, and the complementary local data lines LOT/B, and written in the memory cell MC coupled to the bit line BL or /BL.

The semiconductor device 100 may employ a plurality of external terminals that include command and address (C/A) terminals coupled to a command and address bus to receive commands and addresses, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to a clock input circuit 122. The external clocks may be complementary. The clock input circuit 122 generates an internal clock ICLK based on the CK and /CK clocks. The ICLK clock is provided to the command control 106 and to an internal clock generator 124. The internal clock generator 124 provides various internal clocks LCLK based on the ICLK clock. The LCLK clocks may be used for timing operation of various internal circuits. The internal data clocks LCLK are provided to the input/output circuit 126 to time operation of circuits included in the input/output circuit 126, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row control 108 and supplies a decoded column address YADD to the column control 110. The row address XADD may be used to specify one or more wordlines WL of the memory array 112 and the column address YADD may specify one or more bit lines BL of the memory array 112. The address decoder 104 may also provide a bank address BADD, which specifies a particular bank of the memory. The bank address BADD may be provided to the row control 108 and/or column control 110 to direct access operations to one or more of the banks.

The row address XADD may include multiple bits. As used herein, the different bits of the row address XADD may be labeled as XADD0-XADDn, where n is the total number of bits of the row address. Accordingly, XADDi may refer to an ith bit of the row address XADD.

Different subsets of the bits of the row address XADD may be associated with different levels of organization of the memory array 112. For example, a subset of the bits of the row address XADD may be a section address which refers to a section of the memory array 112 containing a number of wordlines and a different subset of the bits of the row address XADD may be a wordline address which refers to a particular wordline within that section. Different arrangements of the row address and wordlines may be used in other embodiments. Although properties and uses of the row address are generally described herein, it should be understood that the column addresses may be organized and used in a similar way in some embodiments.

The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and/or bank address BADD to indicate the memory cell(s) to be accessed.

The commands may be provided as internal command signals to a command control 106 via the command/address input circuit 102. The command control 106 includes circuits to decode the internal command signals to generate various internal signals and commands for performing operations. For example, the command control 106 may provide a row command signal to select a wordline and a column command signal to select a bit line.

The device 100 may receive an access command which is a row activation command ACT. When the row activation command ACT is received, a row address XADD is supplied with the row activation command ACT.

The device 100 may receive an access command which is a read command. When a read command is received, a bank address BADD and a column YADD address are timely supplied with the read command, read data is read from memory cells in the memory array 112 corresponding to the row address XADD and column address YADD. The read command is received by the command control 106, which provides internal commands so that read data from the memory array 112 is provided to the read/write amplifiers 120. The read data is output to outside from the data terminals DQ via the input/output circuit 126.

The device 100 may receive an access command which is a write command. When the write command is received, a bank address and a column address are timely supplied with the write command, write data supplied to the data terminals DQ is written to a memory cells in the memory array 112 corresponding to the row address and column address. The write command is received by the command control 106, which provides internal commands so that the write data is received by data receivers in the input/output circuit 126. Write clocks may also be provided to the external clock terminals for timing the receipt of the write data by the data receivers of the input/output circuit 126. The write data is supplied via the input/output circuit 126 to the read/write amplifiers 120, and by the read/write amplifiers 120 to the memory array 112 to be written into the memory cell MC.

The device 100 may also receive commands causing it to carry out refresh operations. A refresh signal AREF may be a pulse signal which is activated when the command control 106 receives a signal which indicates a refresh mode. In some embodiments, the refresh command may be externally issued to the memory device 100. In some embodiments, the refresh command may be periodically generated by a component of the device. In some embodiments, when an external signal indicates a refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to a refresh control circuit 116. In some embodiments, there may be a refresh control circuit 116 associated with each bank. The bank address BADD may indicate one or more of the refresh control circuits 116 to be activated. The refresh control circuits 116 may receive the refresh signal AREF in common, and may generate and provide one or more refresh row address(es) RXADD in order to perform one or more refresh operations in the associated memory bank. In some embodiments, a subset of the memory banks may be given refresh commands. For example, one or more additional signals may indicate which of the refresh control circuits 116 should provide refresh address(es) responsive to AREF. In another example, AREF may only be provided to refresh control circuits 116 which are associated with the subset of memory banks which are refreshing.

Focusing on the operation of a given refresh control circuit, the refresh control circuit 116 supplies a refresh row address RXADD to the row control 108, which may refresh one or more wordlines WL indicated by the refresh row address RXADD. The refresh control circuit 116 may control a timing of the refresh operation based on the refresh signal AREF. In some embodiments, responsive to an activation of AREF, the refresh control circuit 116 may generate one or more activations of a pump signal, and may generate and provide a refresh address RXADD for each activation of the pump signal (e.g., each pump).

One type of refresh operation may be an auto-refresh operation. Responsive to an auto-refresh operation the memory bank may refresh a group of rows of the memory, and then may refresh a next group of rows of the memory bank responsive to a next auto-refresh operation. The refresh control circuit 116 may provide a refresh address RXADD which indicates a group of wordlines in the memory bank. The refresh control circuit 116 may generate a sequence of refresh addresses RXADD such that over time the auto-refresh operation may cycle through all the wordlines WL of the memory bank. The timing of refresh operations may be such that each wordline is refreshed with a frequency based on a normal rate of data degradation in the memory cells.

Another type of refresh operation may be a targeted refresh operation. Repeated access to a particular row of memory (e.g., an aggressor row) may cause an increased rate of decay in neighboring rows (e.g., victim rows) due, for example, to electromagnetic coupling between the rows. In some embodiments, the victim rows may include rows which are physically adjacent to the aggressor row. In some embodiments, the victim rows may include rows further away from the aggressor row. Information in the victim rows may decay at a rate such that data may be lost if they aren't refreshed before the next auto-refresh operation of that row. In order to prevent information from being lost, it may be necessary to identify aggressor rows and then carry out a targeted refresh operation where a refresh address RXADD associated with one or more associated victim rows is refreshed.

In some embodiments, the identified rows may be potential aggressor rows (and/or rows with a higher likelihood of being aggressors) and the targeted refresh operations may be carried out on potential victim rows (and/or rows with a higher likelihood of being victims). For purposes of clarity, the identified rows will be referred to as aggressors and the rows which are refreshed will be referred to as victims, even though the memory may identify aggressor wordlines which are not necessarily being accessed enough to cause an increased rate of data degradation in neighboring rows, and may refresh victim wordlines where an increased rate of data degradation is not necessarily taking place.

The refresh control circuit 116 may receive the row addresses XADD provided by the address decoder 104 and may determine which wordlines are aggressors based on the row addresses XADD. The refresh control circuit 116 may track accesses to the wordlines based on the row address XADD and may determine which wordlines are aggressors based on an amount of the accesses. The refresh control circuit may divide the total number of wordlines into portions and have an accumulator voltage for each of the portions. For example, a first portion of the wordlines may be associated with a first accumulator voltage, a second portion of the wordlines may be associated with a second accumulator voltage, etc. In some embodiments, the portion of the wordlines associated with the accumulator voltage may be organized into one or more sections of wordlines each of which contain one or more wordlines which are physically adjacent to each other. Each accumulator voltage may be updated any time any of the wordlines in the portion represented by the accumulator voltage is accessed. For example, the accumulator voltage may be increased by increasing the charge on a capacitor in some embodiments. In some embodiments, the accumulator voltage may be decreased by decreasing a charge on the capacitor. In this manner all accesses to all wordlines may be tracked by the accumulator voltages, but there may be fewer count values than the number of total wordlines.

In some embodiments, wordlines may be grouped together based on the row addresses associated with those wordlines. If only a particular subset of the row address is specified (e.g., a particular value of that subset of bits) then all wordlines which share the specified value of that subset as part of their row address may be identified. For example, each portion of the wordlines tracked by an accumulator voltage may be specified by a particular value of a subset of the row address XADD. If a row address contains a first subset (e.g., a section address) specifying a section of wordlines and a second subset (e.g., a wordline address) specifying a particular wordline within that section, then the wordline address subset of the row address may be ignored, and the refresh control circuit 116 may have an accumulator voltage associated with the value of the section address. Accordingly, the accumulator voltage may be updated anytime any wordline within the section(s) associated with the section address. In some embodiments, the section address may be truncated (e.g., some of the bits of the section address may be ignored) into a multi-section address, which represents all of the wordlines in a number of different sections. Each count value may be specified by a particular value of the grouped section address and may represent accesses to any wordline in any of the sections associated with the multi-section address. It should be understood that a row address XADD may include many subsets describing many different levels of organization, and that examples of a particular way of apportioning the wordlines of the memory array 112 based on the row address are only meant to aid in understanding of the concept. Other methods associating groups of wordlines with a counter value may be used in other embodiments.

When the refresh control circuit 116 determines that at least one wordline of a portion of the wordlines tracked by an accumulator voltage is an aggressor (e.g., when the accumulator voltage crosses a threshold, such as a reference voltage), one or more victim addresses associated with the portion of the wordlines represented by that accumulator voltage may be provided. In some embodiments where each access increases an accumulator voltage, the refresh control circuit 116 may determine when the accumulator voltage is greater than the reference voltage. In some embodiments, where each access decreases an accumulator voltage, the refresh control circuit 116 may determine when the accumulator voltage is less than the reference voltage. Since each accumulator voltage may represent a number of different wordlines, victim addresses may be provided for each of the wordlines in the group associated with a given accumulator voltage. In addition, victim addresses may be provided for wordlines which are physically nearby (e.g., adjacent to) one of more of the wordlines in the group of wordlines associated with the accumulator voltage. For example, if the group of wordlines is arranged into one or more sections, the victim addresses may be associated with each wordline in the section(s) as well as the wordlines which are nearby to the wordlines at either end of the section(s).

The refresh control circuit 116 may have a number of accumulator voltages which between them represent accesses to every wordline of the memory array 112. In some embodiments, the refresh control circuit 116 may include a targeted refresh queue which may store addresses for targeted refresh operations. In some embodiments, the targeted refresh queue may store victim addresses. In some embodiments, the targeted refresh queue may store an aggressor address (or a portion of an aggressor address) associated with the portion of the wordlines represented by the accumulator voltage. When an accumulator voltage crosses the threshold (e.g., a reference voltage) an address associated with that accumulator voltage may be added to the targeted refresh queue, and the accumulator voltage may be reset to an initial voltage (e.g., a ground voltage, a system voltage such as VDD, etc.). When there is a refresh command (e.g., AREF, a refresh pump) an address stored in the targeted refresh queue may be selected and one or more victim addresses based on the address in the queue maybe provided as the refresh address RXADD.

In some embodiments, the memory may perform targeted refresh operations on the victim addresses (e.g., by providing victim addresses based on the targeted refresh queue as the refresh address RXADD) as long as the targeted refresh queue contains at least one unrefreshed address. In some embodiments, if a refresh operation is indicated, but the targeted refresh queue is empty (e.g., contains no addresses and/or contains only addresses which have already had their victims refreshed), an auto-refresh operation may be performed instead. In some embodiments, certain refresh operations may be reserved for targeted refresh operations, and if the targeted refresh queue is empty, no refresh operation may be performed during those reserved operations.

The targeted refresh queue may include one or more priority flags associated with the addresses stored therein. Each time the accumulator voltage crosses the threshold, if the address(es) associated with that accumulator voltage are already stored in the targeted refresh queue, another priority flag may be set and the accumulator voltage may be reset to an initial level. For example, when a queue address is added to the targeted refresh queue, if the queue address is already in the targeted refresh queue instead of being stored, another priority flag associated with the stored queue address is set. The device 100 may prioritize refreshing addresses in the targeted refresh queue based on the number of priority flags which are set. For example, addresses where more priority flags may be selected for refreshing before addresses where less priority flags are set.

The power supply terminals are supplied with power supply potentials VDD and VSS. The power supply potentials VDD and VSS are supplied to an internal voltage generator circuit 128. The internal voltage generator circuit 128 generates various internal potentials VPP, VOD, VARY, VPERI, and the like based on the power supply potentials VDD and VSS supplied to the power supply terminals. The internal potential VPP is mainly used in the row control 108, the internal potentials VOD and VARY are mainly used in the sense amplifiers SAMP included in the memory array 112, and the internal potential VPERI is used in many peripheral circuit blocks.

The power supply terminals are also supplied with power supply potentials VDDQ and VSSQ. The power supply potentials VDDQ and VSSQ are supplied to the input/output circuit 126. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 126 so that power supply noise generated by the input/output circuit 126 does not propagate to the other circuit blocks.

Figure 2:
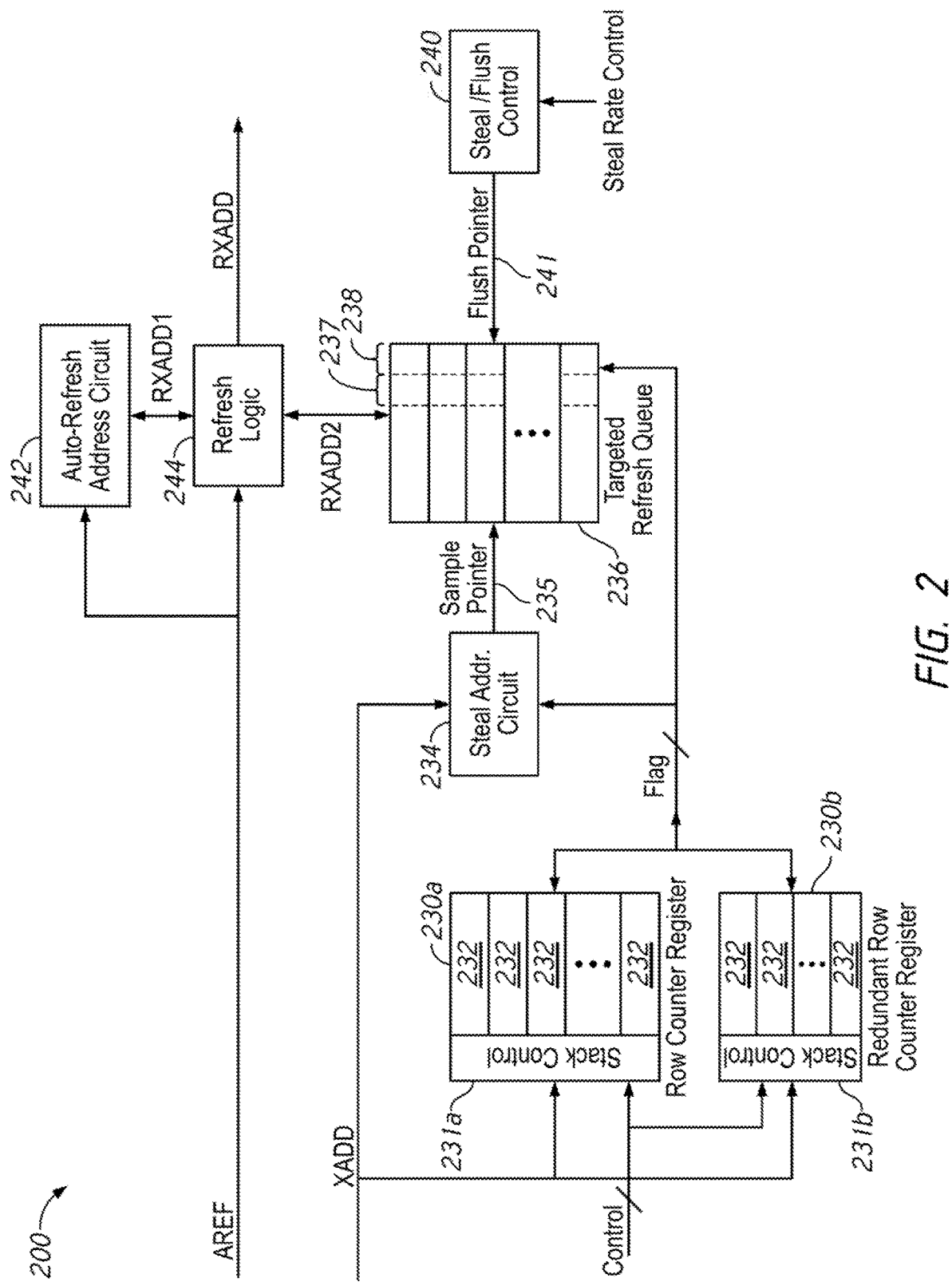
FIG. 2 is a block diagram of a refresh control circuit according to an embodiment of the present disclosure.

FIG. 2 is a block diagram of a refresh control circuit according to an embodiment of the present disclosure. The refresh control circuit 200 may implement the refresh control circuit 116 of FIG. 1 in some embodiments. The refresh control circuit 200 receives a row address XADD (e.g., from the address decoder 104 of FIG. 1) and the refresh signal AREF, and provides a refresh address RXADD with a timing based on AREF. The refresh address RXADD may either be an auto-refresh address RXADD1 as part of an auto-refresh operation, or a targeted refresh address RXADD2 as part of a targeted refresh operation. The targeted refresh addresses RXADD2 may be determined based on tracking the row addresses XADD over time.

The refresh control circuit 200 includes a row access tracking stack 230a (and its associated stack control circuit 231a) and a redundant row access tracking stack 230b (and its associated stack control circuit 231b). The row access tracking stack 230a and the redundant row access tracking stack 230b each include a number of unit cells 232 each of which includes a number of circuits which store and update one of the accumulator voltages. While the term stack is used in this disclosure, it should be understood that the stacks 230a-b may represent any form of data storage unit including the unit cells 232 as described herein.

The redundant row access tracking stack 230b includes unit cells 232 which track accesses to redundant rows of the memory (e.g., rows used in repair operations). Row access tracking stack 230a includes unit cells 232 which track accesses to non-redundant rows of the memory. Since there may generally be more non-redundant rows than redundant rows of memory, the stack 230a may include more unit cells 232 than the stack 230b. The stacks 230a and 230b may generally include similar components and may function in a similar fashion. For the sake of brevity, operation will be described with respect to a generic row access tracking stack 230 and stack control circuit 231.

The row access tracking stack 230 includes a number of unit cells 232, each of which tracks accesses to a portion of the wordlines of the memory. The row access tracking stack 230 also includes a stack control circuit 231, which includes a number of circuits which are coupled in common to the different unit cells 232. The stack control circuit 231 may be used to provide signals in common to all of the unit cells 232 or to one or more specified unit cells 232. An example stack control circuit, which may be used as the stack control circuit 231 is described in more detail in FIGS. 3-4. An example unit cell which may be used as the unit cell 232 is described in more detail in FIGS. 5-6.

Each time a row address XADD is received, the stack control circuit 231 may selectively activate one of the unit cells 232 associated with the portion of the wordlines including the wordline represented by the row address XADD. In the embodiment of FIG. 2, the activated unit cell 232 may increase the stored accumulator voltage and the unit cell 232 and stack control circuit 231 may compare the updated accumulator voltage to a reference voltage. Based on that comparison (e.g., when the accumulator voltage is greater than a reference voltage), the row access tracking stack 230 may change the state of a flag signal Flag provided by the unit cell 232. It should be understood that while the embodiments discussed herein may generally refer to increasing the accumulator voltage, in some embodiments, the activated unit cell 232 may decrease the voltage and the stack control circuit 231 may determine if the updated accumulator voltage is less than the reference voltage.

Figure 7:
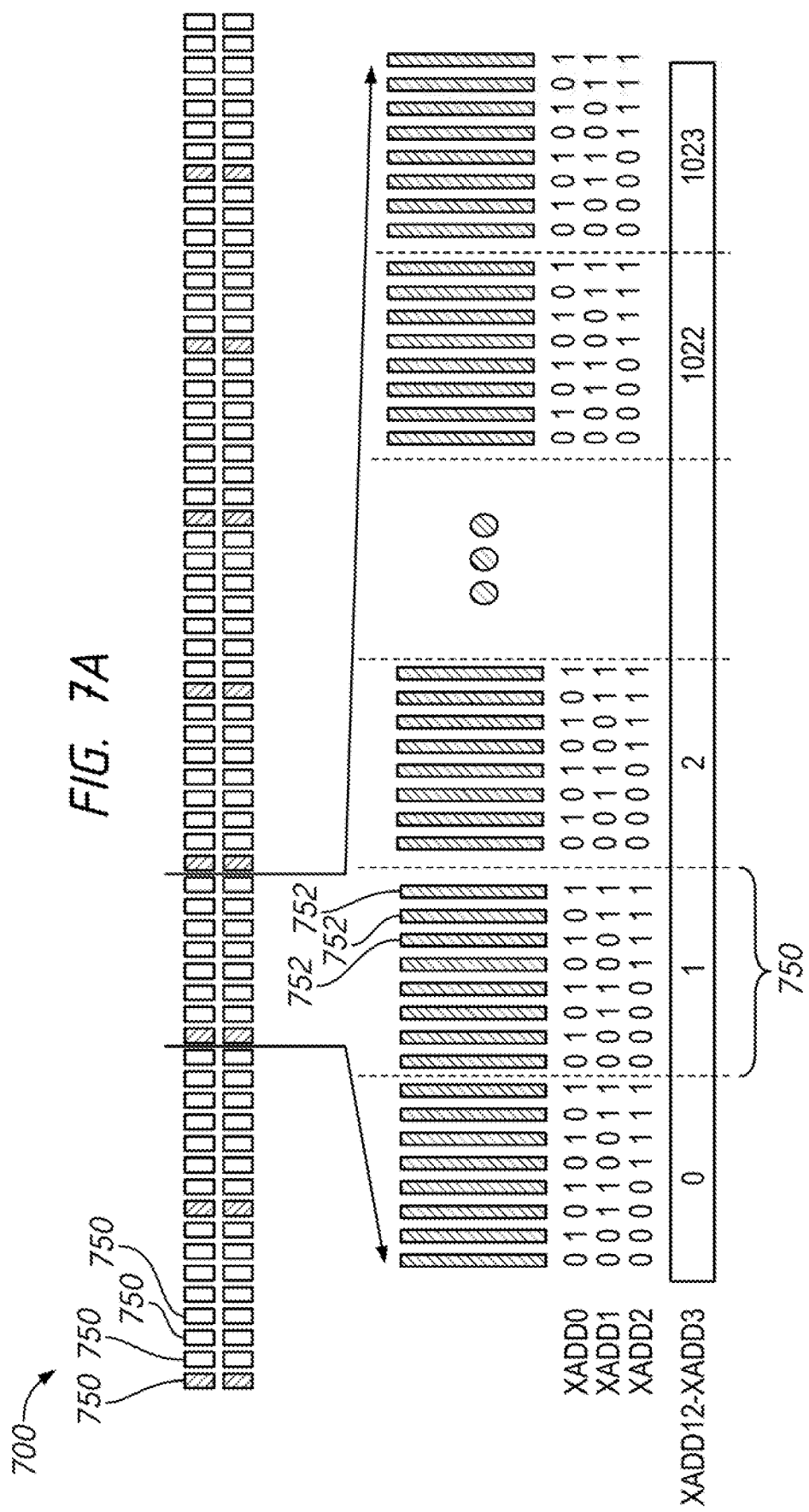
FIGS. 7A-7B are block diagrams of a memory array according to an embodiment of the present disclosure.

Responsive to the flag signal Flag of one of the unit cells 232 changing states, a steal address circuit 234 may store addresses in a targeted refresh queue 236 based on the row address XADD. The targeted refresh queue 236 includes a number of files, each of which stores a victim address and one or more priority flags. The steal address circuit 234 may use logic to direct a sampler pointer 235 which indicates which file of the targeted refresh queue 236 the next address is inserted into. In some embodiments, the steal address circuit 234 may determine victim addresses based on XADD, and the victim addresses may be stored in targeted refresh queue 236. In some embodiments, the steal address circuit 234 may add the row address XADD (or a portion of the bits of the row address XADD) to the targeted refresh queue 236. In embodiments where XADD (or a portion of XADD) is stored in the targeted refresh queue 236, the refresh logic circuit 244 may calculate the victim addresses after receiving the address RXADD2 stored in the targeted refresh queue 236. Details of determining victim addresses are discussed in more detail in FIGS. 7-8.

In the embodiment of FIG. 2, the targeted refresh queue 236 includes a first priority flag 237 and a second priority flag 238. More or fewer priority flags may be used in other embodiments. When the accumulator voltage in a unit cell 232 rises above the threshold, the unit cell 232 may check the state of the first and the second priority flags 237 and 238. If neither of the priority flags 237, 238 is at a high level (e.g., neither is set), then the steal address circuit 234 may store an address based on the address XADD in the targeted refresh queue 236 at a location (e.g., a file) based on the sample pointer 235. The accumulator voltage may then be reset to an initial level. If the first flag 237 is already at a high level (e.g., indicating that the accumulator voltage previously rose above the reference voltage), the second priority flag 238 may be changed to a high level, and the first priority flag 237 may be kept at a high level. The steal address circuit 234 may only store the address in the targeted refresh queue 236 responsive to the first priority flag 237 changing from a first state to a second state. Thus, if an address is already located in the targeted refresh queue 236, it will not be loaded a second time.

A refresh logic circuit 244 provides the refresh address RXADD with a timing based on the refresh signal AREF. The refresh address RXADD may either be an auto-refresh address RXADD1 provided by an auto-refresh address circuit 242 or a targeted refresh address (e.g., one or more victim addresses) based on the address RXADD2 provided by the targeted refresh queue 236. The queue address in the targeted refresh queue 236 to be provided as the address RXADD2 is indicated by a flush pointer 241 which is directed by a flush control circuit 240. The flush control circuit 240 may cause the flush pointer 241 to prioritize files of the targeted refresh queue 236 based on the number of priority flags 237, 238 which are set. Addresses where the first and the second priority flags 237 and 238 are both at the high level may be provided as the targeted refresh address RXADD2 before address where only the first priority flag 237 is at the high level.

The stack control circuit 231 may receive the row address XADD and provide one of the count values from the row counter stack 230 to the counter logic circuit 234 based on a value of a subset of the bits of the row address XADD. Each of the count values of the row counter stack 230 may be associated with a portion of the wordlines of the memory. Each portion of the wordlines may be specified by a value of the subset of the bits of the row address XADD. Each of the count values may be associated with a particular value of the subset of the bits of the row address. Thus, there may be a first count value for a first value of the subset of the row address, a second count value for a second value of the subset of the row address, etc. If the subset of the row address has N possible values, then the row count stack 230 may be N registers deep.

The decoder in the stack control circuit 231 may only receive (and/or only pay attention to) a subset of the bits of the row address XADD. In some embodiments, the targeted refresh queue may store the same subset of the row address as the stack 230. In turn, the refresh logic 244 may determine victim addresses based off of that subset of row address. For example, the refresh logic 244 may determine the victim addresses based on a multi-section address including the fourth through thirteenth bits of the row address (e.g., XADD3-XADD12). The refresh logic 244 may provide a number of victim addresses which include victim addresses associated with all of the wordlines represented by the subset of the row address. In some embodiments, each victim address may represent multiple wordlines of the memory, and all of the wordlines represented by a given victim address may be refreshed simultaneously. In some embodiments, the refresh logic 244 may also provide victim addresses which represent wordlines not associated with the portion of the row address. The determination of the victim addresses is discussed in more detail in FIGS. 7-8.

The targeted refresh queue 236 may be a register stack which stores the queue addresses provided by the steal address circuit 234. Each register of the targeted refresh queue 236 may include a number of bits to store a queue address provided by steal address circuit 234. For example, each register may store a same number of bits as are used by the decoder in the stack control circuit 231 to activate a unit cell 232. In one example, where the decoder is responsive to 10 bits (e.g., XADD3-XADD12), each register of the targeted refresh queue 236 may store 10 bits worth of the row address XADD. In some embodiments, the targeted refresh queue 236 may be, for example, 64 registers deep. Other depths of the targeted refresh queue 236, such as 50 or 100, may be used in other examples.

Each register of the targeted refresh queue 236 may include a number of priority flags (e.g., first priority flag 237 and second priority flag 238). Each register may include some number of extra bits of storage to contain the priority flags. For example, the priority flags 237-238 may each be a single bit, and thus each register may include a bit for the first priority flag 237 and a bit for the second priority flag 238. The flags 237 and 238 may be set (e.g., active) when they are at a high logical level, and not set (e.g., inactive) when at a low logical level. Once a priority flag 237/238 is set, it may generally remain set, until the address in that register is refreshed, at which point both of the priority flags 237 and 238 may be reset to an inactive state.

When a unit cell 232 indicates that a current address XADD should be added to the targeted refresh queue 236, the address (or a portion thereof) may be inserted into the targeted refresh queue 236 at a register indicated by the sample pointer 235. The steal address circuit 234 may monitor the state of the priority flags 237 and 238 and move the sample pointer 235, in part based on the states of the priority flags. In general, the sample pointer 235 may progress through a sequence of the registers (e.g., register (0), register(1), . . . , register(n), register(0), . . . , etc.), but may skip certain registers in the sequence based on the state of their flags.

In general, the steal address circuit will direct the sample pointer 235 towards registers with less priority flags active. After an address is added to the current location of the sample pointer 235, the sample pointer 235 may move to a next register in the sequence. If the first and the second priority flags 237 and 238 are both at a low level (e.g., inactive), the sample pointer 235 may remain at that location. If the first priority flag 237 is set, but the second priority flag 238 is not set, the sample pointer 235 may skip that register and move to a next register in the sequence. If all of the registers in the targeted refresh queue 236 have the first priority flag 237 set (e.g., after the sample pointer 235 has looped back around), then the sample pointer 235 may remain at the next register with the first priority flag 237 set but not the second priority flag 238. In some embodiments, the steal address circuit 234 may not point to any register which has the second priority flag 238 at a high level. Accordingly, if the sample pointer 235 moves to a register which has the second priority flag 238 at a high level, it may move to the next register. If all of the registers have the second priority flag 238 at a high level, the steal address circuit 234 may not add the address to the targeted refresh queue 236, and may not add any address to the targeted refresh queue 236 until at least one register is refreshed causing its priority flags to be reset to an inactive level.

The refresh logic circuit 244 provides the refresh address RXADD with a timing based on the signal AREF. In some embodiments, the refresh logic circuit 244 may provide a refresh address RXADD each time there is an occurrence of AREF. In some embodiments, the refresh logic circuit 244 may provide multiple refresh addresses RXADD responsive to each occurrence of AREF. For example, the refresh logic circuit 244 may provide a set number of 'pumps' responsive to receiving an occurrence of AREF, and a refresh address RXADD may be provided for each pump.

Each time the refresh logic circuit 244 provides a refresh address RXADD, either an auto-refresh address RXADD1 or a victim address based on the queue address RXADD2 may be provided as the refresh address RXADD. The auto-refresh address RXADD1 may be provided by an auto-refresh address circuit 242. Each auto-refresh address RXADD1 may be associated with a number of wordlines of the memory. After an auto-refresh address RXADD1 is provided, the auto-refresh address circuit 242 may provide a next auto-refresh address RXADD1 associated with a next group of wordlines in a sequence. The auto-refresh address circuit 242 may provide the auto-refresh addresses RXADD1 in a sequence such that over time all the wordlines of the memory array are refreshed by the auto-refresh addresses RXADD1. After a last auto-refresh address RXADD1 in the sequence is provided, the first auto-refresh address RXADD1 in the sequence may be provided again. In some embodiments, the auto-refresh address circuit 242 may determine the sequence of auto-refresh addresses with internal logic. For example, one or more portions of the auto-refresh address RXADD1 may be incremented after each auto-refresh address RXADD1 is provided to determine a next auto-refresh address RXADD1.

The flush control circuit 240 may direct a flush pointer 241 which may indicate which register of the targeted refresh queue 236 provides the address stored in the indicated register as the queue address RXADD2. In a manner similar to the sample pointer 235, the flush pointer 241 may generally proceed through a sequence of the registers (e.g., register(0), register(1), . . . , register(n), register(0), . . . , etc.), but may skip certain registers based on the number of priority flags 237 and 238 which are set. In general, the flush control circuit 240 may prioritize directing the flush pointer 241 towards registers with more priority flags 237 and 238 set. It should be noted that the sample pointer 235 and flush pointer 241 may generally move independently of each other.

The flush control 240 may move at a rate based on a steal rate control signal, which may indicate the rate of targeted refresh operations. In some embodiments, the refresh logic 244 may provide the steal rate control signal. In some embodiments, the refresh logic circuit 244 and the flush control circuit 240 may both receive the steal rate control signal from an external source. In an example operation, when flush pointer 241 moves to a next register, the flush control circuit 240 may check the status of the priority flags 237 and 238. If the second priority flag 238 is active, the flush pointer 241 may remain at that register. If the second priority flag 238 is not active, the flush pointer 241 may move on to a next register, unless none of the registers have the second priority flag 238 active, in which case the flush pointer 241 may stop at the next register where the first priority flag 237 is active but the second priority flag 238 is not. If none of the registers in the targeted refresh queue 236 have either of the priority flags 237-238 active, then no address may be provided as the queue address RXADD2.

In some embodiments, the refresh logic circuit 244 may determine whether to provide an auto-refresh address RXADD1 or an address based off a queue address RXADD2 based on the state of the targeted refresh queue 236. For example, the refresh logic circuit 244 may provide targeted refresh addresses (e.g., victim addresses) as long as an address RXADD2 is being provided by the targeted refresh queue 236 and may provide the auto-refresh address RXADD1 as the refresh address RXADD if no address RXADD2 is being provided. In some embodiments, the refresh logic circuit 244 may provide victim addresses based on the address RXADD2 at a rate determined by the steal rate control signal, and if no address RXADD2 is available, those refresh operations may be skipped.

Figure 3:
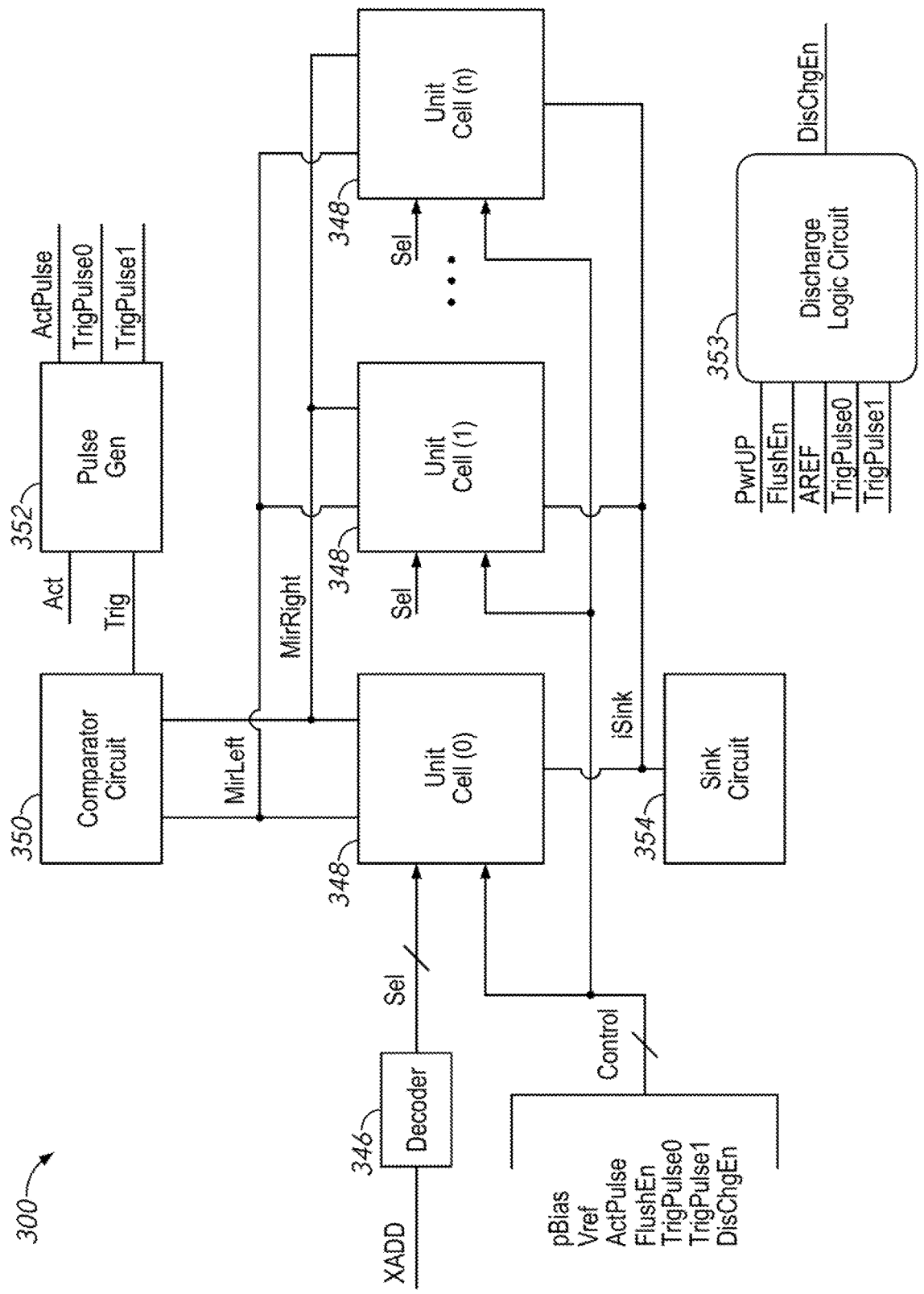
FIG. 3 is a block diagram of a row access tracking stack according to an embodiment of the present disclosure.

FIG. 3 is a block diagram of a row access tracking stack according to an embodiment of the present disclosure. The row access tracking stack 300 may, in some embodiments, be included in the row access tracking stack 230 of FIG. 2.

The row access tracking stack 300 includes a number of different unit cells 348, which may, in some embodiments, implement the unit cells 232 of FIG. 2. The row access tracking stack 300 also includes various components, such as the decoder circuit 346, comparator circuit 350, pulse generator circuit 352, and sink circuit 354 which may, in some embodiments, be included in the stack control circuit 231 of FIG. 2.

The decoder circuit 346 receives a row address XADD and provides a select signal Set to one of the unit cells 348. The stack 300 includes a number of different unit cells 348, each of which may be numbered from unit cell(0) to unit cell(n). Each unit cell 348 may be activated by a select signal Sel(0) to Sel(n). The decoder circuit 346 may provide a select signal Sel(i) to the unit cell(i) based on the value of the received row address XADD. The select signal Sel(i) may be provided at a high voltage (e.g., a system voltage such as VDD or VPERI) and the other select signals (e.g., Sel(0 to i−1) and Sel(i+1 to n)) may be provided at a low voltage (e.g., a ground voltage such as VSS).

For example, in some embodiments the row address XADD may be 17 bits long to represent 2^17 total wordlines in a bank (not including the redundant wordlines). The fourth through sixteenth bits (e.g., XADD3-16) may be a section address which represents a particular section of the memory, with each section containing 8 wordlines, which are addressed by the first through third bits (e.g., XADD0-XADD2) as a wordline address. The decoder circuit 346 may group some of the sections together by ignoring some of the bits of the section address, which may be considered to be a multi-section address. For example the decoder circuit 346 may only pay attention to a multi-section address including the fourth through thirteenth bits of the row address (e.g., XADD3-XADD12) such that each multi-section address represents sixteen of the sections. Each unit cell 348 may therefore be associated with a value of the multi-section address (e.g., XADD3-XADD12). Thus the row access tracking stack 300 may include 1024 unit cells (e.g., n=1023), one for each of the values of the multi-section address XADD3-XADD12 (e.g., 2^10 total values). Each unit cell 348 in such a stack 300 may represent eight wordlines (since the wordline address is ignored) in each of 16 different sections of the memory (since the section address is truncated into a multi-section address). Thus, in this example embodiment, each unit cell is tracking accesses to 128 total wordlines. Different organizations of the memory and the row address may be used in other examples. In other embodiments, the row address may have more (or fewer) bits to represent more or fewer wordlines of a memory.

When a unit cell 348 receives its associated select signal Sel at a high level, the unit cell 348 may be activated. When a given unit cell 348 is activated, it may increase an accumulator voltage on a capacitor in the unit cell 348.

Each of the unit cells 348 may be coupled in common to a comparator circuit 350. Each of the unit cells 348 may include a comparator portion which is coupled to voltages MirLeft and MirRight provided by the comparator circuit 350. The voltages MirLeft and MirRight may be coupled in common to the comparator portions in each of the unit cells 348. Each unit cell 342 is also coupled in common to a sink circuit 354, which may generate a sink current iSink, which drains from the unit cell 348 to the sink circuit 354. When a unit cell 348 is activated by the select signal Sel it may couple the comparator portion in that unit cell 348 between the voltages MirLeft and MirRight and the sink current iSink. A first current may flow from the voltage MirLeft to the sink, and the magnitude of the first current may be based on the reference voltage, and a second current may flow from MirRight to the sink, with the second current having a magnitude based on the accumulator voltage in that unit cell 348. The comparator circuit 350 may provide a trigger signal Trig based on the relative levels of the first and the second currents.

The pulse generator circuit 352 receives the signal Trig from the comparator circuit 350 and provides trigger signals TrigPulse0 and TrigPulse1. The first trigger signal TrigPulse0 may be provided at a first time, and the second trigger signal TrigPulse1 may be provided at a second time. The first and second trigger signals TrigPulse0 and TrigPulse1 may be provided to the unit cells 348.

The unit cell 348 which is receiving the select signal Sel (e.g., the unit cell 348 which is active) may send one or more flag signals (e.g., signal Flag of FIG. 2) based on the current states of the flag signals, and the first and the second trigger signals TrigPulse0 and TrigPulse1. The unit cell 348 may include a flag logic circuit which determines when to change the states of the flag signals.

Each unit cell may also be coupled in common to a number of control signals Control, which may be used to manage the operation of the different components of the stack 300. For example, the control signals may include signals such as a bias voltage pBias, a reference voltage VRef, a flag reset signal FlushEn, and a voltage reset signal DisChgEn. In some embodiments, the bias voltage pBias may be provided by the sink circuit 354, and may be an adjustable voltage. The pulse generator circuit 352 may receive an activation signal (e.g., Act of FIG. 1) and provide a signal ActPulse responsive to the activation signal. The pulse generator circuit 352 may provide additional control signals such as ActPulse, TrigPulse0, and TrigPulse1. In general, the different control signals may be provided in common to each of the unit cells 348, and the select signal Sel may determine which unit cell 348 is active and responds to the various control signals.

The voltage reset signal DisChgEn may be provided by a discharge logic circuit 353. The voltage reset signal DisChgEn may be provided at a high logical level to cause the accumulator voltages in the unit cell(s) 348 specified by the select signal Sel to reset to an initial level (e.g., a ground voltage). The voltage reset signal DisChgEn may be provided in common to all of the unit cells 348. In the embodiment of FIG. 3, the discharge logic circuit 353 may work with the decoder 346 to provide the select signals to determine which of the unit cells 348 are reset. In some embodiments (not shown), the discharge logic circuit 353 may also provide the select signal Sel (e.g., in addition to the decoder 346), and use one or more signals along with internal logic to determine when to provide the signal DisChgEn, and what value of the select signal Sel to provide.

The discharge logic circuit 353 may provide the signals DisChgEn to the unit cells 348 specified by the select signal Sel responsive to several different conditions. For example, each time the signal FlushEn is received at a high level, the discharge logic circuit 353 may provide the signal DisChgEn at a high level. Since the signal FlushEn may generally indicate that a wordline associated with a unit cell 348 has been refreshed, and since the signal Sel may still indicate which unit cell 348 has been refreshed, the discharge logic circuit 353 may cause the accumulator voltage in the unit cell 348 to reset when the wordlines associated with that unit cell are refreshed. The discharge logic circuit may also reset a unit cells 348, each time a new priority flag associated with that unit cell is set (e.g., as indicated by the signals TrigPulse0 or TrigPulse1). In other words, each time a given unit cells 348 accumulator voltage rises above the threshold (e.g., reference voltage Vref), the discharge logic circuit 353 may reset the accumulator voltage in that unit cell 348. Accordingly, responsive to receiving TrigPulse0 or TrigPulse1 at a high logical level, the discharge logic circuit 353 may provide the signals DisChgEn at a high logical level. The discharge logic circuit 348 may also provide the signal DisChgEn at a high logical level each time the refresh signal AREF is received.

In some situations, the discharge logic circuit 353 may cause all of the unit cells 348 to reset (e.g., by providing the signal DisChgEn at the same time a select signal is provided to all of the unit cells 348). For example, when the system is initialized (e.g., in response to a power up, responsive to a system reset, etc.). For example, the discharge logic circuit 353 may receive a signal PwrUp which indicates if the system is powered up or not. If the system is not powered up, the signal PwrUp may be at a low logical level, and the discharge logic circuit 353 may provide the signal DisChgEn at a high logical level which indicates if the system is powered up or not. If the system is not powered up, the signal PwrUp may be at a low logical level, and the discharge logic circuit 353 may provide the signal DisChgEn at a high logical level.

Figure 4:
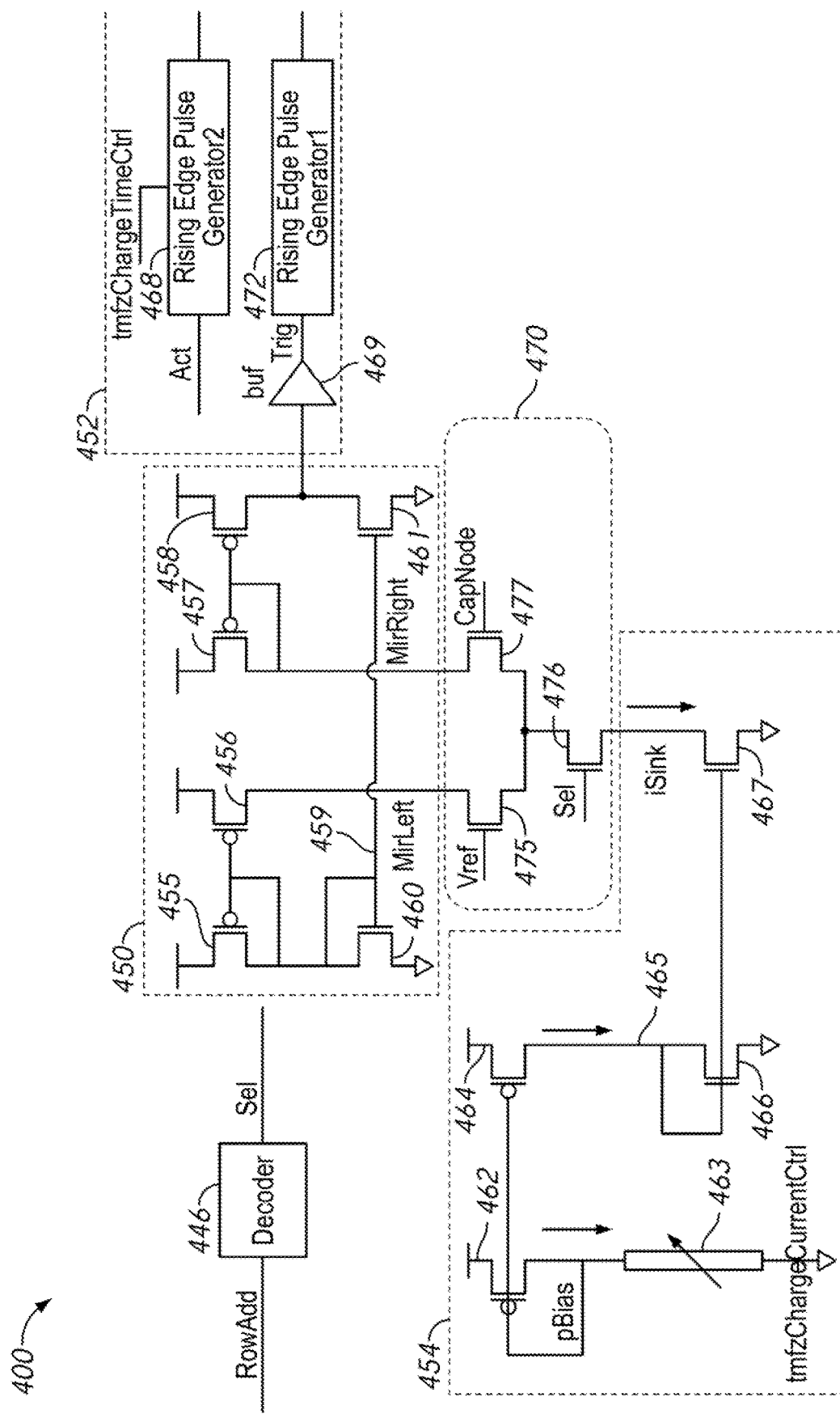
FIG. 4 is a schematic diagram showing a stack control circuit according to an embodiment of the present disclosure.

FIG. 4 is a schematic diagram showing a stack control circuit according to an embodiment of the present disclosure. The stack control circuit 400 includes a decoder 446, a comparator circuit 450, a pulse generator circuit 452, and a sink circuit 454. These may, in some embodiments, be included in the decoder 346, comparator circuit 350, pulse generator circuit 352, and sink circuit 354, respectively, of FIG. 3. Also shown in FIG. 4 is a comparator portion 470 of a unit cell (e.g., unit cell 348 of FIG. 3) to help demonstrate the operation of the comparator circuit 450 and sink circuit 454. The comparator portion 470 may be repeated in each of the unit cells (e.g., the unit cells 232 of FIG. 2 and/or 348 of FIG. 3).

The decoder 446 receives the row address XADD and provides a select signal Sel. In some embodiments, the signal Sel may be a multi-bit signal, with each of the bits of the signal Sel provided to a different one of the unit cells. Each bit of the signal Sel may be associated with a value of a subset of bits of the row address XADD. There may be a unit cell for each value of the subset of bits of the row address, and together the unit cells may represent all values of the subset of bits. For example, the decoder 446 may monitor the fourth through thirteenth bits of the row address XADD (e.g., XADD<12:3> which may have 1024 different values. Accordingly, there may be 1024 different unit cells and 1024 different select bits (e.g., Sel<1023:0>).

When a row address XADD is received, the bit of the select signal Sel associated with that row address XADD may be provided at a high level (e.g., a system voltage such as VPERI). In some embodiments, the bit of the select signal Sel may be provided at a high level for a set period of time after the row address XADD is received. In some embodiments, the bit of the select signal Sel may be provided at a high level as long as the current row address XADD is received.

Responsive to an associated bit of the select signal Sel being at a high level, the comparator circuit 450 and sink circuit 454 may work together with the comparator portion 470 of the unit cell activated by the bit of the select signal Sel to compare an accumulator voltage CapNode of that unit cell to a reference voltage Vref.

The sink circuit 454 includes a first transistor 462 with a source coupled to a system voltage (e.g., VPERI or VSS) and a gate and sink coupled to a bias voltage pBias. The first transistor 462 may be a p-type transistor. The bias voltage pBias is also coupled to a ground voltage (e.g., VSS) through a resistor 463. A current I may flow from the first transistor 462 through the resistor 463. The resistor 463 may be an adjustable resistor in some embodiments and may be used to adjust a size of the current I and a level of the bias voltage pBias. In some embodiments, the current I may be about 0.5 µA. Other values for the current I may be used in other examples.

The sink circuit 454 also includes a second transistor 464, which has a gate coupled to the bias voltage pBias, a source coupled to a system voltage, and a drain coupled to a node 465. The second transistor 464 may be a p-type transistor. The sink circuit 454 also includes a third transistor, with a drain and gate coupled in common to the node 465 and a source coupled to a ground voltage (e.g., VSS). The third transistor 466 may be an n-type transistor. The first, second, and third transistors, 462, 464, and 465, along with the resistor 463 may act as a current mirror, and the current I may also flow from the second transistor 464 towards the third transistor 466.

The sink circuit 454 also includes a fourth transistor 467, which is has a drain coupled to an output of the comparator portion 470, a source coupled to a ground voltage, and a gate coupled to the node 465. The fourth transistor 467 may cause a current iSink to flow through the fourth transistor 467 to the ground voltage when one of the coupled comparator portions 470 is active. The sink current iSink may have a larger magnitude than the current I. In some embodiments, the sink current iSink may be about 8 µA.

The comparator circuit 450 includes a first transistor 455 with a source coupled to a system voltage (e.g., VSS or VPERI) and a gate and drain coupled in common to a node 459. The first transistor 455 may be a p-type transistor. The comparator circuit 450 also includes a second transistor 456 with a source coupled to the system voltage, a gate coupled to the node 459, and a drain coupled to a voltage MirLeft. The second transistor 456 may be a p-type transistor. The comparator circuit 450 also includes a third transistor 457 and a fourth transistor 458. The third transistor 457 has a source coupled to the system voltage and a gate and source coupled in common to a voltage MirRight. The fourth transistor 458 has a source coupled to a system voltage, a gate coupled to the voltage MirRight, and a drain coupled to an output of the comparator 450. The third and fourth transistor 457 and 458 may be p-type transistors. The comparator circuit 450 also includes a fifth transistor 460 and a sixth transistor 461. The fifth transistor 460 has a drain and gate coupled in common to the node 459 and a source coupled to a ground voltage (e.g., VSS). The sixth transistor 461 has a gate coupled to the node 459, a source coupled to the ground voltage, and a drain coupled to the output of the comparator circuit 450. The fifth and sixth transistors 460 and 461 may be n-type transistors.

The first, second, and fifth transistors, 455, 456, and 460 may work together as a first current mirror, and the third, fourth, and sixth transistors 457, 458, and 461 may work together as a second current mirror. In general, the more current is allowed to flow from the voltage MirLeft through the comparator portion 470 to the sink circuit 454, the lower the voltage on the sixth transistor 461 is, and the more active the sixth transistor 461 is. The more current is allowed to flow from the voltage MirRight through the comparator portion 470 to the sink circuit 454, the more active the fourth transistor 458 is. Depending on which of the fourth or sixth transistors 458 and 461 are more active, the output of the comparator circuit 450 may be more strongly coupled to a system voltage through the fourth transistor 458 or more strongly coupled to the ground voltage through the sixth transistor 461. Accordingly, if more current flows from the voltage MirLeft, than from the voltage MirRight, then the output of the comparator portion 450 may be a ground voltage. If more current flows from the voltage MirRight than from the voltage MirLeft, then the output of the comparator portion 450 may be a system voltage (e.g., a high voltage).

The comparator portion 470 may control how much current flows from the voltages MirLeft and MirRight to the sink circuit 454. Only a single comparator portion 470 is shown, however there may be a comparator portion 470 for each unit cell, all coupled in common to the voltage MirLeft and MirRight and also the sink current iSink. The comparator portion 470 includes a first transistor 475, a second transistor 477 and a third transistor 476. All three of the transistors 475-477 may be n-type transistors. The first transistor 475 has a drain coupled to the voltage MirLeft and a gate coupled to the reference voltage Vref. The second transistor 477 has a drain coupled to the voltage MirRight and a gate coupled to the accumulator voltage CapNode<i> for the unit cell(i). The first and second transistors 475 and 477 have sources coupled in common to the drain of the third transistor 476. The third transistor 476 has a source coupled to the sink current iSink provided by the sink circuit 454 and a gate coupled to a bit of the select signal Sel<i> associated with the unit cell(i) including the comparator portion 470.

When the bit of the select signal Sel<i> is at a high level, the third transistor 476 may be active, and may couple the sources of both the first transistor 475 and the second transistor 477 to the current iSink. A current may flow from the voltage MirLeft through the first transistor 475 to the current iSink proportional to how high the reference voltage Vref is. A current may flow from the voltage MirRight through the second transistor 477 to the current iSink proportional to how high the accumulator voltage CapNode<i> is. Accordingly, if the accumulator voltage CapNode<i> is higher than the reference voltage Vref, then more current may flow from MirRight than MirLeft, and the output of the comparator circuit 450 may be a high level (e.g., a system voltage).

The pulse generator circuit 452 includes a buffer circuit 469 with an input terminal coupled to the output of the comparator circuit 450 and an output terminal which provides a trigger signal Trig. When the input of the buffer circuit 469 rises to a high level (e.g., because the voltage CapNode rises above the voltage Vref), the signal Trig may switch from a low level to a high level. The first rising pulse generator 472 has an input terminal coupled to the signal Trig, and an output terminal which provides the signal TrigPulse0. Responsive to a rising edge of the signal Trig (e.g., when the signal Trig transitions from a low level to a high level), the first rising pulse generator 472 may provide a first trigger pulse TrigPulse0. The first trigger pulse TrigPulse0 may be a pulse, where a signal transitions from a low level to a high level, remains at the high level for a set length of time (generally short relative to the time between pulses) and then transitions back to a low level. The pulse generator circuit 452 also includes a delay circuit 473 with an input terminal coupled to the signal TrigPulse0. The delay circuit 473 receives the signal TrigPulse0 at a first time, and then provides the signal TrigPulse1 at a second time after the first time.

The pulse generator circuit 452 may also include a second rising pulse generator 468 which has an input terminal coupled to the activation signal Act. When there is a rising edge of the activation signal Act, the second rising pulse generator 468 may provide a pulse of the signal ActPulse. The width of each pulse of ActPulse (e.g., how long ActPulse is at a high level) may be adjustable. The signals TrigPulse0, TrigPulse1 and ActPulse may be provided in common to the unit cells.

FIG. 5 is a schematic diagram of a unit cell according to an embodiment of the present disclosure. The unit cell 500 may, in some embodiments, be included in the unit cell 232 of FIG. 2 and/or the unit cell 348 of FIG. 3. The unit cell 500 includes an accumulator circuit 505, a comparator portion 510, and a flag logic circuit 515. The comparator portion 510 may generally be similar to the comparator portion 470 of FIG. 4, and the transistors 540-544 may generally be similar to the transistors 475-477 of FIG. 4. For the sake of brevity, the comparator portion 510 will not be described in detail again.

The accumulator circuit 505 stores a voltage CapNode based on the charge on a capacitor 530. Responsive to a select signal and an activation signal, the voltage CapNode may be increased by adding charge to the capacitor 530. The accumulator circuit includes a NAND gate 516, which has an input terminal coupled to the signal ActPulse (e.g., from the pulse generator 468) based on the signal Act, indicating an access operation. The other input terminal of the NAND gate 516 is coupled to the bit of the select signal Se associated with the unit cell 500. Accordingly, when both ActPulse and Sel are at a high level, it indicates that as part of an access operation, an address was received associated with the portion of the wordlines associated with the unit cell 500. The NAND gate 516 provides a signal Act1F to an inverter circuit 518, which provides a signal Act1. The signals Act1F and Act1 may be complimentary to each other and have opposite logical levels.

The accumulator circuit 505 includes a first transistor 520, which has a source coupled to a system voltage (e.g., VDD, VPERI) and a drain coupled to a voltage chargeLine. The gate of the first transistor 520 is coupled to the bias voltage pBias, which is provided by the sink circuit (e.g., sink circuit 454 of FIG. 4). The first transistor 520 may be a p-type transistor. The bias voltage pBias may be adjustable (e.g., by adjusting the resistance of resistor 463 of FIG. 4), which may control how much charge is added to the capacitor 530 (e.g., by controlling how much current flows through the first transistor 520) each time the signals Sel and ActPulse are received at a high level.

The accumulator circuit 505 includes a second transistor 522 and a third transistor 524 which are activated to couple the voltage chargeLine to the voltage CapNode, increasing the charge on the capacitor. The second transistor 522 has a source coupled to the voltage charge line and a drain coupled to the voltage CapNode. The gate of the second transistor 522 is coupled to the signal Act1F, which is at a low level when the signals ActPulse and Sel are both high. The second transistor 522 may be a p-type transistor. The third transistor 524 has a source coupled to the voltage chargeLine, a drain coupled to the voltage CapNode, and a gate coupled to the signal Act1, which is at a high level when Act1F is at a low level. The third transistor 524 may be an n-type transistor.

The voltage CapNode is coupled to ground through a capacitor 530. Accordingly, when the signal Act1F is at a low level and the signal Act1 is at a high level, then the second and the third transistors 522, 524 may be active and current may flow from the voltage chargeLine to the voltage CapNode, which may add charge to the capacitor 530, increasing the voltage CapNode. The amount that the voltage CapNode is increased responsive the signals ActPulse and Sel (e.g., the step size) may be based, in part, on the voltage pBias and the width of the signal ActPulse. In some embodiments, the voltage pBias may be adjusted by adjusting the resistance of the resistor 463 of FIG. 4. In some embodiments, the width of the signal ActPulse may be adjusted by changing a setting of the pulse generator circuit (e.g., by changing a control signal of the rising pulse generator 468 of FIG. 4). The step size may also depend, in part, on a capacitance of the capacitor 530. In some embodiments, it may be desirable to use a capacitor 530 with a relatively large capacitance. For example, in some embodiments, the capacitor 530 may be an switched capacitor or a crown capacitor to achieve a high capacitance in a relatively small layout area. In some embodiments, the step size may be kept small, to limit unintended couplings, such as a parasitic capacitance on the voltage chargeLine. For example, in some embodiments, the step size may be about 1 mV. Other step sizes may be used in other examples. In some embodiments, additional steps may be taken, such as minimizing the length of the conductive element carrying the voltage chargeLine.

In some embodiments, the accumulator circuit 505 may also include an optional fourth transistor 526 and fifth transistor 528. The fourth transistor 526 may have a drain coupled to the voltage CapNode, a gate coupled to the signal Act1 and a source which is floating (e.g., not coupled to any component or signal of the accumulator circuit 505). The fourth transistor 526 may be a p-type transistor. The fifth transistor 528 may have a drain coupled to the voltage CapNode, a gate coupled to the signal Act1F, and a source which is floating. The fifth transistor 528 may be an n-type transistor. The fourth and fifth transistors 526, 528 may activate at the same time as the second and third transistors 522, and 524 and may help to limit the decoupling impact of the transistors 522 and 524 switching on the voltage CapNode.

The voltage CapNode may be discharged to reset the voltage CapNode to an initial voltage (e.g., a ground voltage) in some conditions. The accumulator circuit 505 may include a sixth transistor 532 and a seventh transistor 534. The sixth transistor 532 has a drain coupled to the voltage CapNode, a gate coupled to the discharge signal DisChgEn (e.g., as provided by the discharge logic circuit 353 of FIG. 3), and a source coupled to a drain of the seventh transistor 534. The seventh transistor 534 has a gate coupled to the select signal Sel, a drain coupled to the source of the sixth transistor 532 and a source coupled to a ground voltage (e.g., VSS). The sixth and seventh transistors 532 and 534 may both be n-type transistors. When both the sixth and seventh transistors 532 and 534 are active (e.g., when the signals Sel and DisChgEn are both at a high level), the voltage CapNode may be coupled to ground through the sixth and seventh transistors 532 and 534. Accordingly, when both the sixth and seventh transistors 532 and 534 are active, the capacitor 530 may discharge to ground, and the voltage CapNode may drop to a ground voltage.

The unit cell 500 may also include a flag logic circuit 515. The flag logic circuit 515 may control the levels of the flag signals Flag0 and Flag1, which may control the state of the priority flags in the targeted refresh queue (e.g., the flags 237 and 238 in queue 236 of FIG. 2). The states of the flag signals Flag0 and Flag1 may be determined based on the current states of the flag signals, the trigger pulses TrigPulse0 and TrigPulse1 which may be provided by the pulse generator circuit (e.g., 352 of FIG. 3 and/or 452 of FIG. 4) responsive to the voltage CapNode crossing a voltage (e.g., the voltage Vref), the select signals Sel, and a flush enable signal FlushEn, which may be provided by the flush control circuit (e.g., 240 of FIG. 2).

The flag logic circuit 515 includes a first AND gate 546 with input terminals coupled to TrigPulse0 and the select signal Sel. The first AND gate 546 provides the signal TrigPulseEn0 at a high level when both the signals TrigPulse0 and Sel are at a high level. The flag logic circuit 515 also includes a second AND gate 548 with input terminals coupled to the signals TrigPulse1 and Sel. The second AND gate 548 provides the signal TrigPulseEn1 at a high level with both TrigPulse1 and Sel are at a high level. Since TrigPulse0 is provided at a first time, and TrigPulse1 is provided at a second time (e.g., based on the delay circuit 473 of FIG. 4), the signal TrigPulseEn0 may also be provided first, followed by the signal TrigPulseEn1 after the delay time. The flag logic circuit 515 also includes a NAND gate 550, which has input terminals coupled to the signals FlushEn and Sel, and outputs the signal FlushEnF, which is at a low logical level when both FlushEn and Set are at a high level.

The flag logic circuit 515 includes a first flag latch 552 and a second flag latch 554. The first flag latch 552 has a inverting reset terminal RstF coupled to the signal FlushEnF, and a set terminal Set coupled to the signal TrigPulseEn0. The first flag latch 552 stores a state of a first priority flag, and provides signals Flag0 and Flag0F which indicate the logical state of the first priority flag (e.g., first priority flag 237 of FIG. 2). The signals Flag0 and Flag0F may be complementary to each other, and may have opposite logical states. When the signal TrigPulseEn0 is at a high level, indicating that the current unit cell is selected, and that the voltage CapNode has increased above a threshold (e.g., reference voltage Vref), the value of the stored first priority flag may be changed to a high logical level (or may be kept at a high level if the first priority flag is already at a high level). When the first priority flag is at a high level, the signal Flag0 may be at a high level, and the signal Flag0F is at a low level. When the first flag latch 552 receives the signal FlushEnF at a low logical level, indicating that the wordlines associated with the unit cell have been refreshed, the state of the first priority flag may be reset to a low logical level. When the first priority flag is at a low logical level, the signal Flag0 may be at a low level, and the signal Flag0F may be at a high level, The second flag latch 554 may operate in a generally similar way to the first flag latch 552. The second flag latch 554 has an inverting reset input terminal RstF coupled to the signal FlushEnF, and a set input terminal Set coupled to the signal TrigPulseEn1. In addition, the second flag latch 554 includes a set enable terminal SetEn coupled to the signal Flag0 and an inverting set enable terminal SetEnF coupled to the signal Flag0F. The second flag latch 554 may provide signals Flag1 and Flag1F, which indicate the state of the second priority flag stored in the second flag latch 554. When the signal Flag0 is high (and the signal Flag0F is low) the second flag latch 554 may be enabled, and may be responsive to the signal TrigPulseEn1. Accordingly, the second priority flag may change to a high level when the first priority flag is at a high level, and the signal TriPulseEn1 is received indicating that the voltage CapNode has exceeded a threshold (e.g., the voltage Vref). The state of the second priority flag may be set to a low level responsive to the signal FlushEnF being at a low level.

Figure 6:
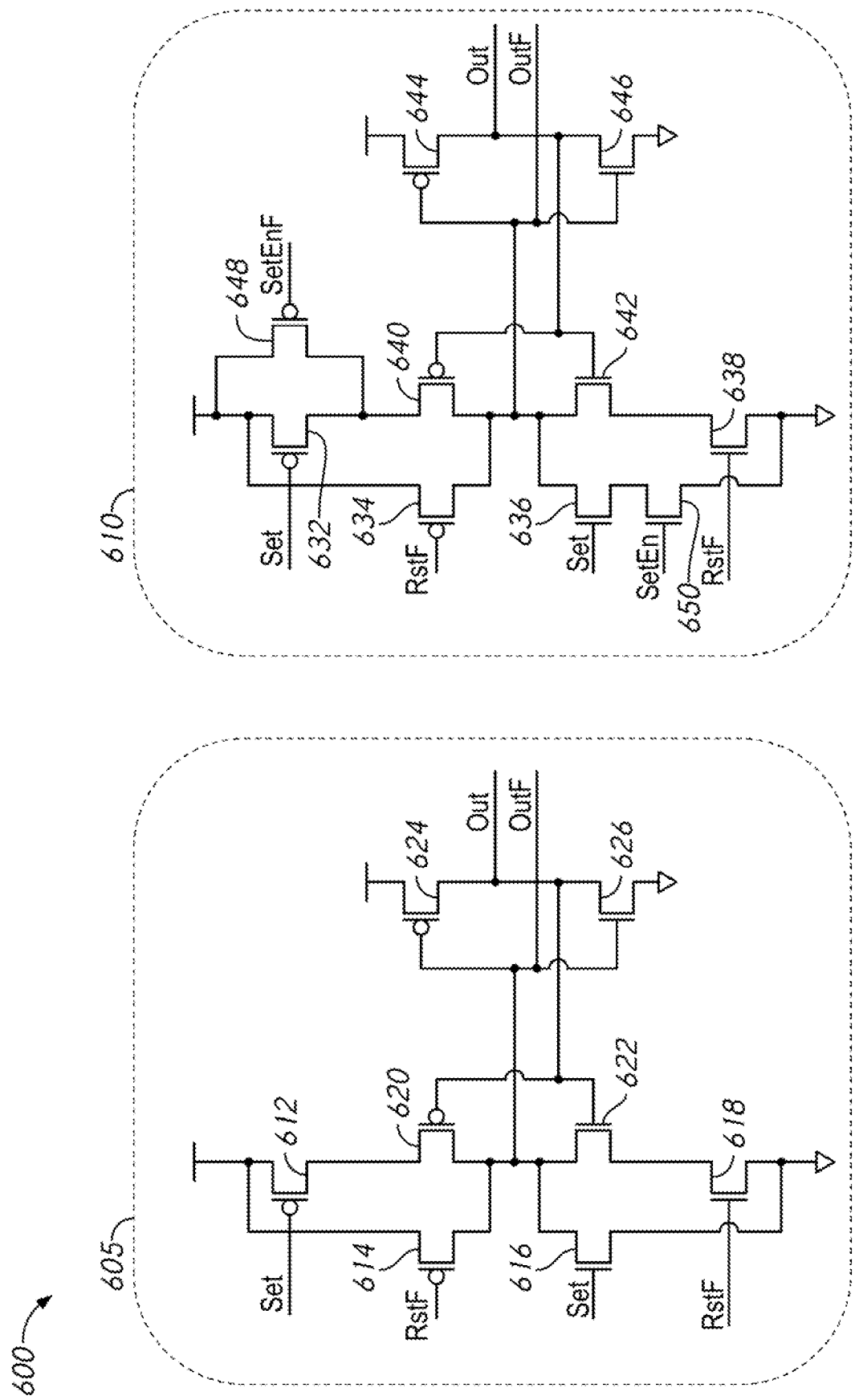
FIG. 6 is a schematic diagram of a first and second flag latch according to an embodiment of the present disclosure.

FIG. 6 is a schematic diagram of a first and second flag latch according to an embodiment of the present disclosure. The first flag latch 605, may, in some embodiments, be included in the first flag latch 552 of FIG. 5. The second flag latch 610, may, in some embodiments, be included in the second flag latch 554 of FIG. 5.

The first flag latch 605 includes a first transistor 612 which has a source coupled to a system voltage (e.g., VPERI, VDD), a gate coupled to the set terminal Set (e.g., the signal TrigPulse0En), and a drain coupled to a source of a fifth transistor 620. A second transistor 614 has a source coupled to the system voltage, a gate coupled to the inverting reset terminal RstF (e.g., to the signal FlushEnF) and a drain coupled to the inverting output terminal OutF (e.g., the signal Flag0F). The first transistor 612 and the second transistor 616 may be p-type transistors. A third transistor 616 has a drain coupled to the terminal OutF (e.g., Flag0F), a source coupled to a ground voltage (e.g., VSS) and a gate coupled to the set terminal Set (e.g., TrigPulseEn0). A fourth transistor 618 has a drain coupled to a source of a sixth transistor 622, a source coupled to the ground voltage, and a gate coupled to an inverting reset terminal RstF. The third and fourth transistors 616 and 618 may be n-type transistors.

The first flag latch 605 also includes transistors 620-626 which function as cross coupled inverters to form a latch which stores the state of the priority flag. The transistors 612-618 may function as switches which are activated by the signals on the terminals Set and RstF to change a state of the flag stored in the latch.

The fifth transistor 620 has a source coupled to a drain of the first transistor 612, a gate coupled to the output terminal Out and a drain coupled to the inverting output terminal OutF. The sixth transistor 622 has a drain coupled to the terminal OutF, a gate coupled to the terminal Out, and a source coupled to the drain of the transistor 618. The seventh transistor 624 has a source coupled to the system voltage, a gate coupled to the terminal OutF and a drain coupled to the terminal Out. The eighth transistor 626 has a drain coupled to the terminal Out, a gate coupled to the terminal OutF and a source coupled to the ground voltage. The transistors 620 and 624 may be p-type transistors. The transistors 622 and 626 may be n-type transistors.

As may be seen, when the signal on the Set terminal Set is provided at a high level (e.g., when TrigPulse0En is high) the transistor 616 is active, and the ground voltage may be coupled to the when the signal on on OutF. When OutF is at a low level (e.g., a ground voltage), the transistor 626 may be inactive and the transistor 624 may be active, which may couple the system voltage to the terminal Out to set the terminal out to a high level. When the terminal Out is at a high level, it may activate the transistor 622 and inactivate the transistor 620. When the signal on the terminal RstF is at a low level (e.g., when FlushEnF is at a low level) the transistor 614 may be active and may couple the terminal OutF to a high level. When OutF is at a high level, the transistor 626 may be active which may couple the terminal Out to a ground voltage thus setting it to a low level.

The second flag latch 610 may generally be similar to the first flag latch 605, and for the sake of brevity, similar components and operations will not be described again. In brief, the transistors 632-646 of the second flag latch 610 may be similar to, and function in a similar manner to, the transistors 612-626 of the first flag latch 605. The second flag latch 610 also includes transistors 648 and 650, which act to enable to second flag latch 610. The transistor 648 has a source coupled to the system voltage (e.g., VDD, VPERI), a drain coupled to the source of the transistor 640, and a gate coupled to the input terminal SetEnF (e.g., the signal Flag0F provided by the output terminal OutF of the first flag latch 605). The transistor 650 has a source coupled to the ground voltage, a drain coupled to the source of the transistor 636, and a gate coupled to the terminal SetEn (e.g., the signal Flag0 provided by the output terminal Out of the first flag latch 605). Accordingly, when the signal Flag0 is at a low level, the transistors 648 and 650 may be inactive, which may prevent the signal on the terminal Set from operating the second flag latch 610.

FIGS. 7A-7B are block diagrams of a memory array according to an embodiment of the present disclosure. FIG. 7A shows a memory array 700 arranged into multiple sections 750. The memory array 700 may implement the memory array 112 of FIG. 1 in some embodiments. FIG. 7B shows an expanded view of a portion of FIG. 7A, with a number of wordlines 752 arranged into different sections 750. FIG. 7B also shows subsets of the row address which may be used to address different sections 750 and/or wordlines 752. The memory array 700 shows an example of a particular way of organizing the wordlines of a memory into portions based on their row addresses. The memory array 700 may represent only a portion of a memory array. Other organizations and/or numbers of the wordlines in a memory array may be used in other embodiments, along with other organizations and/or lengths of row addresses.

The memory array 700 includes a number of sections 750. Each section 750 includes a number of wordlines 752. Within a given section 750, the wordlines 752 may generally be arranged along a direction and adjacent to each other, such that a first wordline 752 (e.g., XADD0-3=000) in the section 750 is adjacent to a second wordline 752 (e.g., XADD0-3=001), the second wordline (001) is adjacent to the first wordline 752 (000) and a third wordline 752 (010), etc. Some sections 750 may be adjacent to other sections 750, such that, for example, a last wordline 752 (111) in a first section 750 (XADD3-12=0000000000) may be adjacent to a first wordline 752 (000) in a second section 750 (XADD3-12=0000000001).

As shown by FIG. 7B, which shows an expanded view of some of the sections 750, different portions of the bits of the row address may refer to organizational levels of the memory array 700. An example row address may include 17 bits. A subset of the row address, such as the multi-section address including the fourth through thirteenth bits (e.g., XADD3-XADD12) may refer to sixteen different sections 750 of the memory (shown shaded in FIG. 3A). Additional bits (for example XADD13-16) may be used to specify a particular one of those sixteen sections 750. A wordline address including the first through third bits (e.g., XADD0-XADD2) may be used to refer to a particular one of the eight wordlines 752 within a section 750. The lower portion of FIG. 7B shows example values of the multi-section address (e.g., XADD3-XADD12) and the individual bits of the wordline address (e.g., XADD0-XADD2). Although only a single section is shown for each value of the multi-section address (XADD3-XADD12), each value of the multi-section address may represent sixteen different sections (e.g., as shown by the shading in FIG. 7A).

As previously discussed, a refresh control circuit (e.g., 116 of FIG. 1, 200 of FIG. 2, and/or 300 of FIG. 3) may have an accumulator voltage (e.g., a unit cell) which is associated with each value of a subset of the row address. For example, there may be a unit cell for each value of the multi-section address (e.g., XADD3-XADD12). Accordingly, each unit cell may represent a number of accesses to any wordline 752 in any of sixteen different sections 750 of the memory array (and thus, access to any one of 128 different wordlines 752). Since there are 1024 different possible values for XADD3-XADD12 (e.g., 2^10 possible values), there may be 1024 different count values, each representing a different set of 16 sections 750 each containing 8 wordlines 752.

Figure 8:
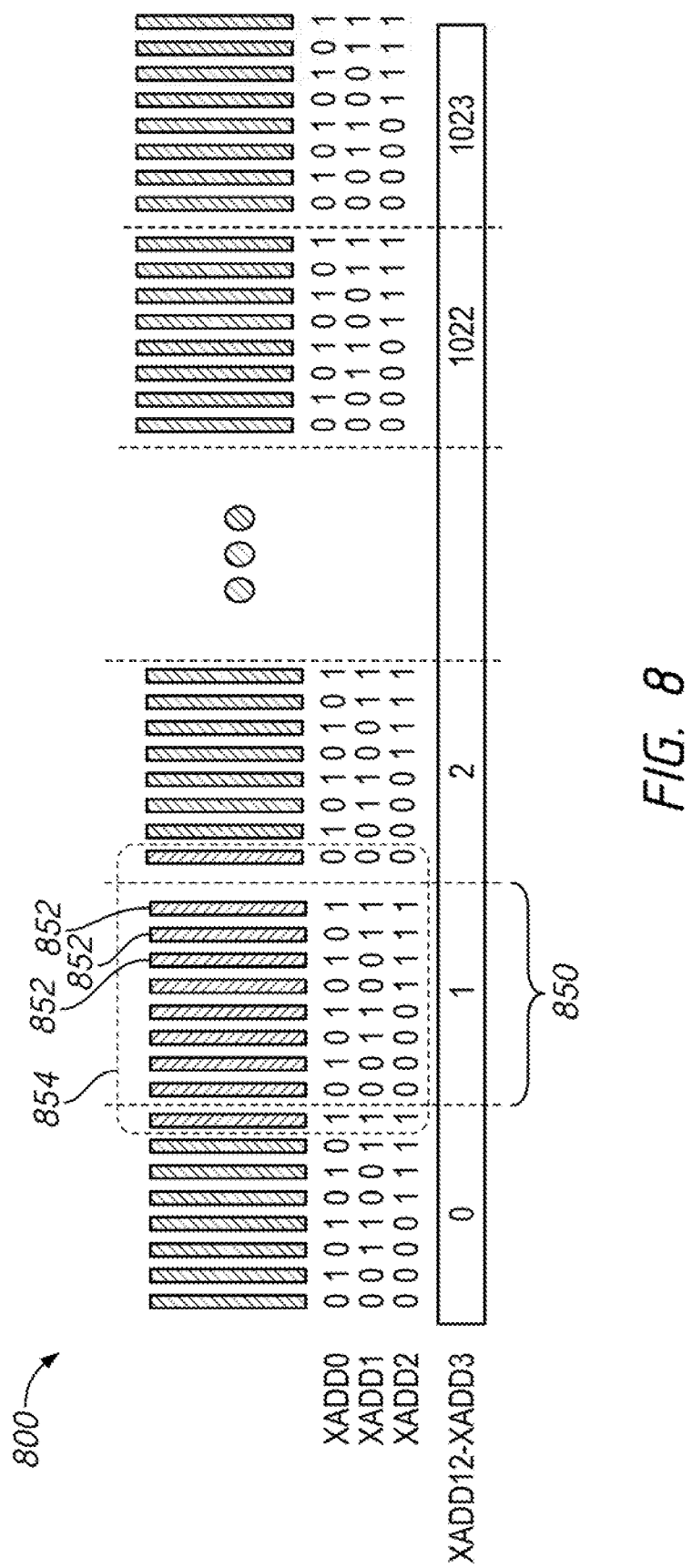
FIG. 8 is a block diagram of a memory array according to an embodiment of the present disclosure.

Since a number of the wordlines 752 are grouped together and associated with the same count value, when the count value exceeds a threshold, it may indicate that at least one of the wordlines 752 represented by the count value is an aggressor. However, since the count value does not distinguish between the wordlines, it may not be known which of the wordlines 752 is an aggressor. Thus, victim addresses may be provided such that each of the potential victim wordlines for all of the wordlines represented by the unit cell are refreshed. FIG. 8 provides example embodiments of how the victim addresses may be determined.

FIG. 8 is a block diagram of a memory array according to an embodiment of the present disclosure. The memory array 800 may represent a portion of the memory array 700 of FIGS. 7A-7B in some embodiments. The memory array 800 represents an example of how victim wordlines may be determined (e.g., by the refresh logic 244 of FIG. 2) based on physical organization of wordlines in a memory. FIG. 8 may be generally similar to FIG. 7B, and for the sake of brevity, similar features will not be described a second time.

As described herein, a refresh control circuit (e.g., 116 of FIG. 1 and/or 200 of FIG. 2) may include a number of unit cells (e.g., unit cells 232), each of which may represent all of the wordlines 852 in a number of sections 850 of the memory array 700. In an example embodiment, a given unit cell may represent accesses to any of 128 wordlines 852 organized into sixteen sections 850 of eight wordlines each. In this example, there may be 1024 different count values (each representing sixteen sections 850) corresponding to the 1024 different values of a subset of the bits of the row address XADD3-XADD12. For the sake of clarity FIG. 8 shows only a single section 850 for each value of the row address portion, however it should be understood that each value of the row address portion may represent additional sections 850 (e.g., fifteen additional sections 850) not shown.

If the accumulator voltage in a unit cell is determined to exceed a threshold, then one or more of the wordlines 852 represented by the count value may be an aggressor. A subset of bits of a row address (e.g., XADD3-12) representing the portion of wordlines 852 may be saved in a targeted refresh queue (e.g., targeted refresh queue 236). The address stored in the queue may be provided to a refresh logic circuit 244 which may perform a targeted refresh operation which refreshes all of the potential victim wordlines for each of the wordlines represented by the address provided by the queue. FIG. 8 shows an embodiment where the wordlines which are physically adjacent to the aggressor wordline are treated as victims. Thus, in order to refresh all of the potential victims, all of the wordlines which are physically adjacent to any of the wordlines 852 represented by the count value must be refreshed (e.g., their addresses may be provided as the refresh address RXADD). The victim addresses may be determined to take advantage of the fact that some of the wordlines 852 represented by the count value may be physically adjacent to each other. In some embodiments, this may be done by providing victim addresses which specify only a certain subset of the bits of a row address, such that the victim address refers to all wordlines which share a particular value of that subset as part of their row address.

The box 854 shows the victim wordlines that may be refreshed after the accumulator voltage associated with a multi-section address with a value of 1 (e.g., XADD3-XADD12=0000000001) exceeds the threshold. The box 854 includes the wordlines within one of the sections 850 with a multi-section address of 1 as well as the adjacent wordlines in adjacent sections. Each of the wordlines 852 shown within the box 854 may be refreshed. Although only a single box 854 is shown, it should be understood that each victim address is associated with multiple wordlines (e.g., fifteen other wordlines in fifteen other sections 850). In some embodiments, the other wordlines associated with the victim addresses may be arranged in a similar fashion to those shown in box 854.

In an example, each section 850 may include eight wordlines 852 which are adjacent to each other. In order to refresh the wordlines 852 which are adjacent to any of these wordlines 852, ten total victim addresses may be refreshed (e.g., by the refresh logic 244 of FIG. 2). Eight of the victim addresses are associated with the eight wordlines 852 of the section 850, and two additional addresses are provided which represent the wordline which is adjacent to the first wordline of the section 850 (e.g., the last wordline of a previous section) and the wordline which is adjacent to the last wordline of the section 850 (e.g., the first wordline of a next section). The wordlines that will have victim addresses provided are represented by the shaded boxes within box 854.

Each victim address may specify a value of both a multi-section address (e.g., XADD3-12) and also a wordline address (e.g., XADD0-2). Thus, each victim address may be associated with a single wordline 852 in each of the different sections 850 represented by the multi-section address (e.g., XADD3-12). In the example discussed herein, each victim address may therefore be associated with sixteen total wordlines 852 in sixteen total sections 850. As an example, the section associated with the multi-section address with a value of 1 (e.g., XADD3-XADD12=0000000001) has been identified as containing an aggressor row (e.g., because a count value associated with that multi-section address has exceeded a threshold). In the embodiment of FIG. 4, ten total victim wordlines may be provided: the last wordline address (e.g., XADD0-XADD2=111) with multi-section address 0 (e.g., XADD3-XADD12=0000000000); all the values of the wordline address (e.g., XADD0-XADD2=000 to 111) in the sections associated with identified aggressor multi-section address (e.g., XADD3-XADD12=0000000001); and the first wordline address (e.g., XADD0-XADD2=000) in the multi-section address with a value of 2 (e.g., XADD3-XADD12=0000000010). The remaining bits of the victim addresses (e.g., XADD13-XADD16) may be ignored, and thus each of the victim addresses may be associated with a single wordline 852 in each of sixteen different sections 850.

Although only a single set of sections 850 is shown, it should be understood that there are additional sections. Thus each victim address may represent multiple wordlines. For example, in an example embodiment, each victim address may represent a wordline in each of sixteen different sections 850. Whenever the victim address is provided as the refresh address RXADD, all of the wordlines in each of the different sections represented by that victim address may be simultaneously refreshed. For example, sixteen wordlines may be simultaneously refreshed.

While the example of FIG. 8 shows an embodiment where the wordlines adjacent to an aggressor are treated as victims, other methods of determining victims may be used in other example embodiments. For example, in some embodiments, both the wordlines which are adjacent (e.g., XADD−1 and XADD+1) to an aggressor as well as the wordlines which are adjacent to the adjacent wordlines (e.g., XADD−2 and XADD+2) may be considered as victims. In this scenario, considering a section of eight adjacent wordlines, twelve total victim addresses may be supplied, including two neighboring wordlines on either side of the section 850.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a plurality of unit cells, each of the unit cells configured to store one of a plurality of voltages and compare the stored one of the plurality of voltages to a reference voltage, wherein responsive to a select signal indicating one of the plurality of unit cells, the selected one of the plurality of unit cells is configured to update the stored one of the plurality of voltages; and
   a stack control circuit, the stack control circuit comprising a decoder circuit configured to receive a row address and provide the select signal to one of the plurality of unit cells based on the row address, wherein the stack control circuit comprises a comparator circuit configured to provide a trigger signal responsive to the stored one of the plurality of voltages crossing the reference voltage.

2. The apparatus of claim 1, wherein the decoder circuit is further configured to provide the select signal based on a subset of bits of the row address.

3. The apparatus of claim 2, wherein the plurality of unit cells each represent a different value of the subset of bits of the row address, and wherein the plurality of unit cells together represent all values of the subset of bits of the row address.

4. The apparatus of claim 1, wherein each unit cell comprises an accumulator circuit including a capacitor and wherein the stored voltage is based on a charge on the capacitor, and wherein responsive to the select signal the unit cell is configured to update the charge on the capacitor.

5. The apparatus of claim 1, wherein each of the plurality of unit cells comprises a comparator portion and wherein the comparator circuit is coupled in common to the comparator portion in each of the plurality of unit cells, wherein responsive to the select signal indicating one of the plurality of unit cells the comparator circuit and the comparator portion in the one of the plurality of unit cells compare the stored one of the plurality of voltages to the reference voltage.

6. The apparatus of claim 1, further comprising:
   a targeted refresh queue configured to store a plurality of row addresses; and
   a steal address circuit configured to selectively store a queue address based on the received row address in the targeted refresh queue based, in part, on the trigger signal.

7. The apparatus of claim 6, wherein one or more victim addresses based on the queue address stored in the targeted refresh queue are refreshed.

8. An apparatus comprising:
   a memory array comprising a plurality of word lines each associated with a row address;
   a row access tracking stack configured to store a plurality of voltages in one of a plurality of unit cells, wherein each of the plurality of voltages is associated with a portion of the plurality of word lines, wherein the row access tracking stack includes a stack control circuit configured to change a selected one of the plurality of voltages in an associated one of the plurality of unit cells responsive to receiving a row address associated with the portion of the plurality of wordlines associated with the selected one of the plurality of voltages, and wherein the row access tracking stack further includes a comparator circuit configured to provide a trigger signal if the selected one of the plurality of voltages crosses a threshold represented by a reference voltage; and
   a targeted refresh queue configured to store a queue addresses based on the row address responsive to the trigger signal.

9. The apparatus of claim 8, wherein the queue address represents a same portion of the plurality of word lines as the portion of the plurality of wordlines associated with the selected one of the plurality of voltages.

10. The apparatus of claim 8, wherein each stored queue address in the targeted refresh queue is associated with a first priority flag and a second priority flag.

11. The apparatus of claim 10, wherein when a first queue address is stored in the targeted refresh queue, the first priority flag is set, and wherein the second priority flag is set responsive to a second queue address provided to the targeted refresh queue matching the first queue address.

12. The apparatus of claim 10, wherein the targeted refresh queue is configured to provide one of the stored queue addresses, and wherein one or more of the plurality of wordlines are refreshed based on the provided one of the stored queue addresses.

13. The apparatus of claim 12, wherein stored queue addresses where the first priority flag and the second priority flag are in an active state are provided before the stored queue addresses where the first priority flag is in the active state and the second priority flag is in an inactive state.

* * * * *